(12) United States Patent
Veernapu

(10) Patent No.: US 9,705,526 B1
(45) Date of Patent: Jul. 11, 2017

(54) ENTROPY ENCODING AND DECODING OF MEDIA APPLICATIONS

(71) Applicant: Intel Corporation, Santa Clara, CA (US)

(72) Inventor: Kiran C. Veernapu, Bangalore (IN)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/073,029

(22) Filed: Mar. 17, 2016

(51) Int. Cl.
*H03M 7/46* (2006.01)
*H03M 7/12* (2006.01)
*H03M 7/40* (2006.01)

(52) U.S. Cl.
CPC ........... *H03M 7/12* (2013.01); *H03M 7/4018* (2013.01); *H03M 7/4075* (2013.01)

(58) Field of Classification Search
CPC ........ H03M 7/46; H03M 7/12; H03M 7/4018; H03M 7/4075
USPC ......................................... 341/50, 51, 67, 63
See application file for complete search history.

(56) References Cited

U.S. PATENT DOCUMENTS

| | | | | |
|---|---|---|---|---|
| 3,739,085 A * | 6/1973 | Rosen | ..................... | H04N 1/419 341/51 |
| 4,494,108 A * | 1/1985 | Langdon, Jr. | ........... | H03M 7/30 341/51 |
| 5,623,262 A * | 4/1997 | Normile | ................. | H03M 7/425 341/106 |
| 5,751,860 A * | 5/1998 | Su | ......................... | H04N 19/593 358/1.9 |
| 6,269,192 B1 * | 7/2001 | Sodagar | ............... | H04N 19/647 341/79 |
| 6,449,394 B1 * | 9/2002 | Florencio | ................ | H03M 7/42 341/67 |
| 6,987,468 B1 * | 1/2006 | Malvar | .................... | H03M 7/46 341/59 |
| 7,733,245 B2 * | 6/2010 | Spencer | ................. | H04B 3/546 341/50 |
| 7,800,520 B2 * | 9/2010 | Lin | ......................... | H03M 7/40 341/106 |
| 2006/0103556 A1 * | 5/2006 | Malvar | .................... | H03M 7/40 341/63 |
| 2006/0132334 A1 * | 6/2006 | Malvar | .................... | H03M 7/48 341/50 |
| 2006/0197689 A1 * | 9/2006 | Lin | ...................... | H03M 7/4006 341/51 |
| 2009/0048852 A1 * | 2/2009 | Burns | ...................... | H03M 7/30 704/503 |
| 2012/0092197 A1 * | 4/2012 | Harada | ................... | H03M 7/40 341/67 |

* cited by examiner

*Primary Examiner* — Jean B Jeanglaude
(74) *Attorney, Agent, or Firm* — Trop Pruner & Hu, P.C.

(57) ABSTRACT

Symbols above a particular number are encoded with Rice encoding. Symbols of the predetermined number or less are encoded with a different technique. The encoded symbols are decoded by determining if the symbols are above the particular number and then applying the corresponding decoding technique.

19 Claims, 18 Drawing Sheets

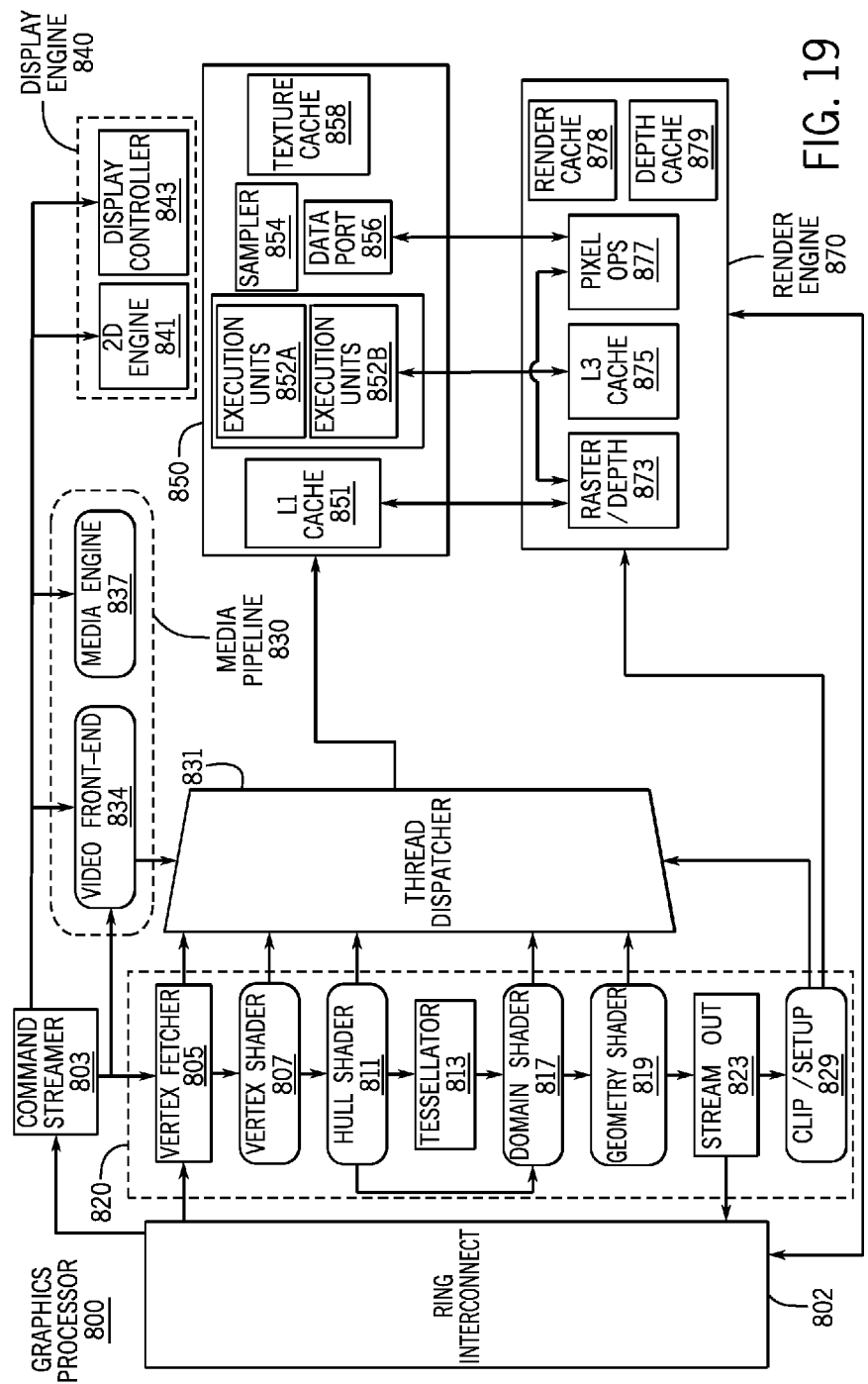

ENTROPY ENCODING AND DECODING OF MEDIA APPLICATIONS

BACKGROUND

This relates generally to graphics processing and particularly to entropy encoding and decoding.

Data compression plays an important role in computer systems by reducing resource usage in both storage and networking. However, data compression also results in additional computational costs. By representing information in a more compact form rather than its original uncompressed form, bandwidth may be reduced. However, some extra processing is needed to convert the data to its compressed format. In other words, using data compression, the size of a particular file can be reduced. Compression is useful when processing, storing or transferring a huge amount of data which results in significant use of resources.

Compression is classified as either lossy or lossless. Lossless compression techniques reconstruct the original data from the compressed file without any loss of data. Thus the information does not change during a compression and decompression processes. These kinds of compression algorithms are also called reversible compression since the original message is reconstructed by the decompression process.

Entropy encoding is a lossless data compression scheme that is independent of the specific characteristics of the medium. By improving an entropy value, one can improve the compression ratio. An encoding technique which has better entropy uses fewer bits to encode the data and therefore achieves more compression represented by a better compression ratio.

Entropy encoding is especially advantageous in media and image applications.

Most lossless compression algorithms perform two steps in sequence. The first step generates a statistical model for the input data. The second step uses this model to map input data to bit sequences in such a way that more probable or more frequently encountered data produces a shorter output than less probable data.

The predictor term takes an input data and tries to reduce its redundancy using a delta computation between neighboring input elements. This kind of mechanism is ideally suited to image and video applications, because the relative differences between neighboring pixels usually does not change a great deal. After computation of the delta values, these values may be encoded using a predefined statistical model.

The statistical model gives information about the probability of the occurrence of the symbols or events. Using this information, an entropy encoder uses a predefined prefix encoding or variable length encoding technique to convert the symbols into compressed data. This information varies with the application. For example, media will have one set of probability values per symbol and text data may have different values.

Compression depends on the way the delta computation is done and the way the encoding is done using a statistical model.

BRIEF DESCRIPTION OF THE DRAWINGS

Some embodiments are described with respect to the following figures:

FIG. 19 is a block diagram of another embodiment of a graphics processor;

DETAILED DESCRIPTION

In some embodiments, compression for media applications can be increased by encoding symbols above a particular symbol number with Rice encoding and encoding symbols of the predetermined number or less with a different technique. The decoding sequence first determines the symbol number and then applies the appropriate decoding technique.

Figure 1:
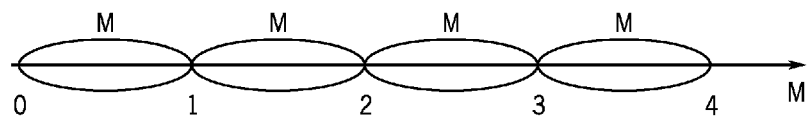
FIG. 1 is a depiction of Golomb encoding according to one embodiment.
Figure 2:
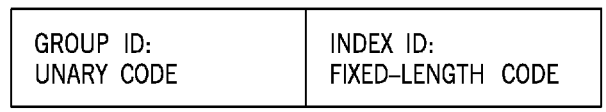
FIG. 2 is a code word representation according to one embodiment.

In Golomb encoding, prefix codes, and numbers or symbols are divided into groups of equal size "m," denoted as Golomb (m) or Golomb-m. Once encoding is done, the next step is to assign smaller symbol values to groups having shorter codes. Symbols in the same group have code words of similar length as shown in FIG. 1. The corresponding code word is defined as (unary code, fixed length code) as depicted as shown in FIG. 2.

So the numbers or symbols are represented with $x=x_q m + x_r$ format, where m is the divisor, $x_q$ is the quotient, represented with unary code, and $x_r$ is the remainder, represented with fixed length code. The unary code converts a given input n into consecutive n ones followed by zero or n zeros followed by one.

Figure 3:
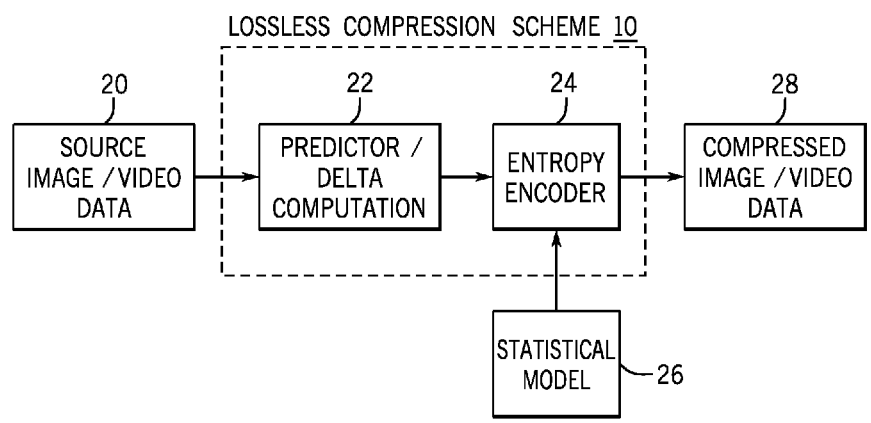
FIG. 3 is compression block diagram according to one embodiment.

The compression begins with receiving a source of image and or video data as indicated at 20 in FIG. 3. A lossless compression scheme 10 is then applied. The predictor/delta computation unit 22 takes the input and tries to reduce the redundancy in the input data using a delta computation between neighboring input elements. Then these values are encoded using a predefined statistical modeling 26 in the entropy encoder 28 to produce the compressed image and/or video data 28.

Figure 4:
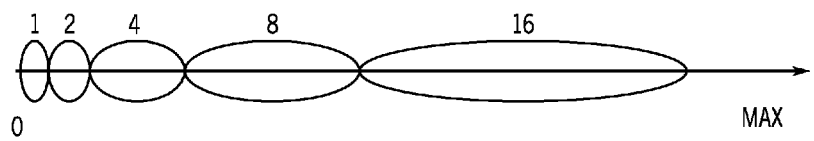
FIG. 4 is an example of Exp-Golomb encoding according to one embodiment.

In exponential Golomb encoding, sometimes called exp-Golomb or ex-Golomb, the group size increases exponentially as shown in FIG. 4. The code still contains two parts, a unary code followed by a fixed length code.

For any geometric distribution, an exp-Golomb code can be found by the optimal prefix code and is as close to the entropy as possible among all the prefix codes.

Golomb-Rice encoding is a special type of Golomb code. It denotes a subset of the family of Golomb codes that produces a simple prefix code. The tunable parameter m in Rice codes is a power of two, wherein Golomb codes use a tunable parameter that is any positive integer.

By using a hybrid version of exp-Golomb encoding and Rice encoding, a number of bits used may be reduced. The first three symbols (0, 1 and 2) are represented with exp-Golomb code and the rest of the symbols are represented by Rice encoding:

| Symbol | Symbol' = Symbol + 1 | Quotient | Reminder | Hybrid Encoding | Code Length |
|---|---|---|---|---|---|
| 0 | 0 | 0 | 0 | 0 | 1 |
| 1 | 1 | 1 | 0 | 100 | 3 |
| 2 | 2 | 1 | 1 | 101 | 3 |
| 3 | 4 | 2 | 0 | 1100 | 4 |
| 4 | 5 | 2 | 1 | 1101 | 4 |
| 5 | 6 | 3 | 0 | 11100 | 5 |
| 6 | 7 | 3 | 1 | 111101 | 5 |
| 7 | 8 | 4 | 0 | 111100 | 6 |
| 8 | 9 | 4 | 1 | 111101 | 6 |
| 9 | 10 | 5 | 0 | 1111100 | 7 |
| 10 | 11 | 5 | 1 | 1111101 | 7 |
| 11 | 12 | 6 | 0 | 11111100 | 8 |
| 12 | 13 | 6 | 1 | 11111101 | 8 |
| 13 | 14 | 7 | 0 | 111111100 | 9 |
| 14 | 15 | 7 | 1 | 111111101 | 9 |

The algorithm to generate the encoding is as follows:
The Encoding Algorithm:
If (symbol <3)
{
Encoding <-Ex-Golomb Code;
{
Else
{
Symbol <-Symbol +1;
Encoding <-Rice Encode;
}
The Decoding Algorithm:
If (symbol <3)
{
Decoding <-Ex-Golumb
Else
{
Decoding <-Rice Decode;
Symbol <-Symbol −1;
}

The entropies for exp-Golomb, Rice and the hybrid encoding described herein are given in the table below:

| Symbol | Exp-Golomb Length | Rice (m = 2) Length | Hybrid Code Length |
|---|---|---|---|
| 0 | 1 | 2 | 1 |
| 1 | 3 | 2 | 3 |
| 2 | 3 | 3 | 3 |
| 3 | 5 | 3 | 4 |
| 4 | 5 | 4 | 4 |
| 5 | 5 | 4 | 5 |
| 6 | 5 | 5 | 5 |
| 7 | 7 | 5 | 6 |
| 8 | 7 | 6 | 6 |
| 9 | 7 | 6 | 7 |
| 10 | 7 | 7 | 7 |
| 11 | 7 | 7 | 8 |
| 12 | 7 | 8 | 8 |
| 13 | 7 | 8 | 9 |
| 14 | 7 | 9 | 9 |

Finally, the encoding and the bit rate are defined below:

$$\text{Bit rate} = \Sigma p_i * i (\text{bits per symbol}) \quad (1)$$

$$\text{Bit rate} = \Sigma p_i * \log_2(1/p_i) \quad (2)$$

The values of entropy along with the bit rates for these codes are computed using the equations 1 and 2 above for different probability values with 15 symbols for every probability value of geometric distribution as tabulated below:

| p | Bit_Rate_ExpG | Bit_Rate_Rice | Bit_Rate Hybrid | Entropy |
|---|---|---|---|---|
| 0.1 | 3.7734 | 3.4349 | 3.7002 | 3.2549 |
| 0.15 | 3.9579 | 3.5498 | 3.8121 | 3.4032 |
| 0.2 | 3.7991 | 3.3829 | 3.6078 | 3.3127 |
| 0.25 | 3.5172 | 3.1425 | 3.3135 | 3.1186 |
| 0.3 | 3.2175 | 2.9115 | 3.0205 | 2.887 |
| 0.35 | 2.9364 | 2.7158 | 2.7588 | 2.65 |
| 0.4 | 2.6847 | 2.5578 | 2.5325 | 2.421 |
| 0.45 | 2.4623 | 2.4324 | 2.3372 | 2.2042 |
| 0.5 | 2.2654 | 2.333 | 2.1664 | 1.9995 |
| 0.55 | 2.0897 | 2.2539 | 2.0142 | 1.8049 |
| 0.6 | 1.9313 | 2.1905 | 1.8762 | 1.6182 |
| 0.65 | 1.787 | 2.1396 | 1.7489 | 1.437 |
| 0.7 | 1.6544 | 2.0989 | 1.6297 | 1.259 |
| 0.75 | 1.5314 | 2.0667 | 1.5167 | 1.0817 |
| 0.8 | 1.416 | 2.0417 | 1.4083 | 0.90241 |
| 0.85 | 1.3068 | 2.023 | 1.3035 | 0.71746 |
| 0.9 | 1.202 | 2.0101 | 1.201 | 0.52111 |
| 0.95 | 1.1003 | 2.0025 | 1.1001 | 0.30147 |

Figure 5:
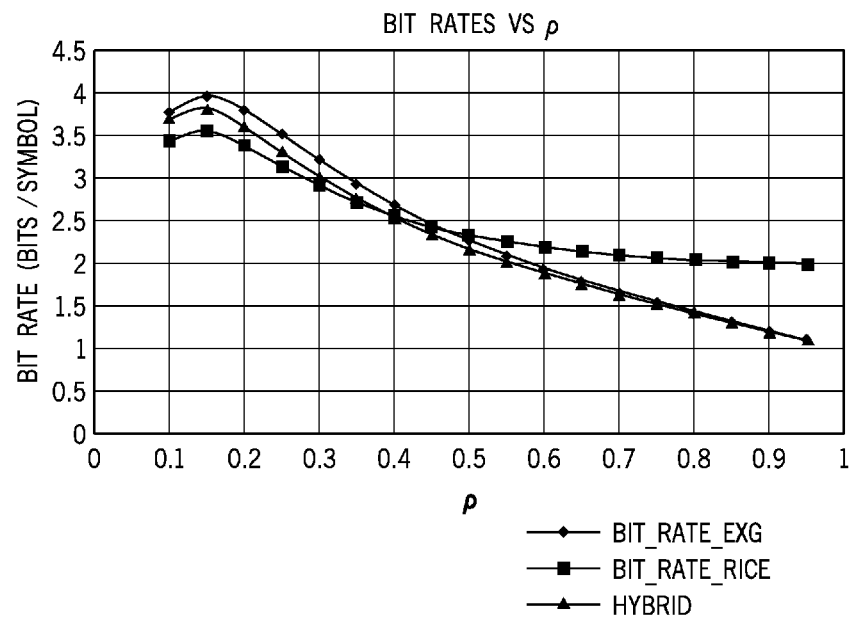
FIG. 5 is a plot of bit rate versus entropy according to one embodiment.

The plot in FIG. 5 depicts a bit rate versus the probability values. For a probability value less than 0.38, Rice encoding has the least bit value and for probability greater than or equal to 0.38, the hybrid encoding has the least bit rate values.

The redundancy is defined as the difference between actual entropy and bit rate for various encodings. The redundancy values are tabulated below:

| p | Entropy | Redundancy_ExpG | Redundancy_Rice | Redundancy_Hybrid |
|---|---|---|---|---|
| 0.1 | 3.2549 | 0.5185 | 0.18 | 0.4453 |
| 0.15 | 3.4032 | 0.5547 | 0.1466 | 0.4089 |
| 0.2 | 3.3127 | 0.4864 | 0.0702 | 0.2951 |
| 0.25 | 3.1186 | 0.3986 | 0.0239 | 0.1949 |
| 0.3 | 2.887 | 0.3305 | 0.0245 | 0.1335 |

-continued

| p | Entropy | Redundancy_ExpG | Redundancy_Rice | Redundancy_Hybrid |
|---|---|---|---|---|
| 0.35 | 2.65 | 0.2864 | 0.0658 | 0.01088 |
| 0.4 | 2.421 | 0.2637 | 0.1368 | 0.1115 |
| 0.45 | 2.2042 | 0.2581 | 0.2282 | 0.133 |
| 0.5 | 1.9995 | 0.2659 | 0.3335 | 0.1669 |
| 0.55 | 1.8049 | 0.2848 | 0.449 | 0.2093 |
| 0.6 | 1.6182 | 0.3131 | 0.5723 | 0.258 |
| 0.65 | 1.437 | 0.35 | 0.7026 | 0.3119 |
| 0.7 | 1.259 | 0.3954 | 0.8399 | 0.3707 |
| 0.75 | 1.0817 | 0.4497 | 0.985 | 0.435 |
| 0.8 | 0.90241 | 0.51359 | 1.13929 | 0.50589 |
| 0.85 | 0.71746 | 0.58934 | 1.30554 | 0.58604 |
| 0.9 | 0.52777 | 0.68089 | 1.48899 | 0.67989 |
| 0.95 | 0.30147 | 0.79883 | 1.70103 | 0.79863 |

Figure 6:
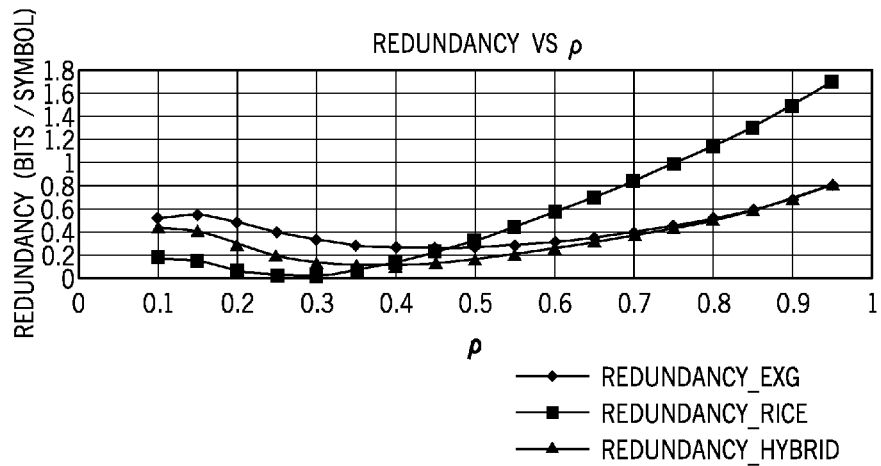
FIG. 6 is a plot of redundancy versus entropy according to one embodiment.

The corresponding plots are shown in FIG. 6. FIG. 6 corroborates the bit rate plot as shown above for a probability greater than 0.38 showing that the hybrid encoding has the least redundancy and hence is ideally suited for data encoding with symbols follow geometric distribution.

Figure 7:
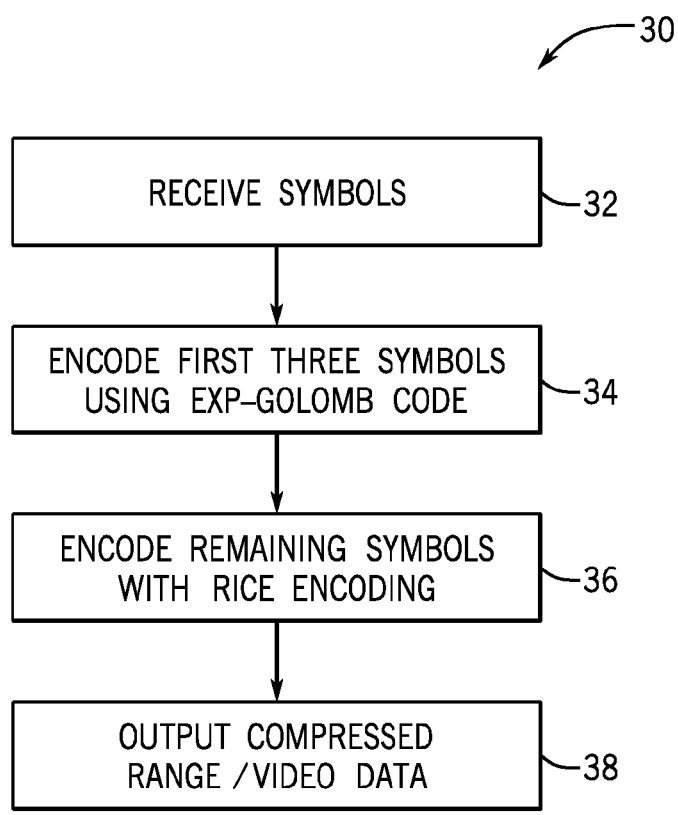
FIG. 7 is a flow chart for one embodiment.

In accordance with one embodiment, a sequence 30 shown in FIG. 7 may be implemented in software, firmware and/or hardware. In software and firmware embodiments, it may be implemented by computer executed instructions stored in one or more non-transitory computer readable media such as magnetic, optical or semiconductor storage. For example in one embodiment, instructions may be stored with a storage integral with a graphics processing unit.

The sequence 30 shown in FIG. 7 begins by receiving symbols as indicated in block 32. As used herein, symbols and numbers are interchangeable. Next the first three symbols are encoded using exp-Golomb code as indicated in block 34. Thereafter the remaining symbols are encoded using Rice encoding as indicated in block 36. Finally, the compressed image/video data is output as indicated in block 38.

Thus, in general, after the symbols are received, the first n symbols are encoded with a first technique and the remaining symbols are encoded with a different technique.

In accordance with another embodiment, in mixed encoding, the first two symbols are represented with unary code and rest of the values are represented with Rice encoding. Unary code is encoding that represents a natural number, n, with n ones followed by zero or n−1 ones followed by zero. The mixed encoding is as follows:

| Symbol | Symbol' | Quotient | Remainder | Mixed Encoding | Code Length |
|---|---|---|---|---|---|
| 0 | 0 | 0 | 00 | 0 | 1 |
| 1 | 1 | 1 | NA | 10 | 2 |
| 2 | 4 | 2 | 0 | 1100 | 4 |
| 3 | 5 | 2 | 1 | 1101 | 4 |
| 4 | 6 | 3 | 0 | 11100 | 5 |
| 5 | 7 | 3 | 1 | 11101 | 5 |
| 6 | 8 | 4 | 0 | 11100 | 6 |
| 7 | 9 | 4 | 1 | 111101 | 6 |
| 8 | 10 | 5 | 0 | 1111100 | 7 |
| 9 | 11 | 5 | 1 | 1111101 | 7 |
| 10 | 12 | 6 | 0 | 11111100 | 8 |
| 11 | 13 | 6 | 1 | 11111101 | 8 |
| 12 | 14 | 7 | 0 | 111111100 | 9 |
| 13 | 15 | 7 | 1 | 111111101 | 9 |
| 14 | 16 | 8 | 0 | 1111111100 | 10 |

The algorithm to generate this mixed encoding is given below:

The Encoding Algorithm:
If (symbol <2)
{
Encoding <-Ex-Unary Code;
{
Else
{
Symbol <-Symbol +2;
Encoding <-Rice Encode;
}
The Decoding Algorithm:
If (symbol <2)
{
Decoding <-Unary;
Else
{
Decoding <-Rice Decode;
Symbol <-Symbol −2;
}

The code lengths for Exp-Golomb, Rice and the mixed encoding are given in the table below:

| Symbol | Exp-Golomb Length | Rice (m = 2) Length | Mixed Code Length |
|---|---|---|---|
| 0 | 1 | 2 | 1 |
| 1 | 3 | 2 | 2 |
| 2 | 3 | 3 | 4 |
| 3 | 5 | 3 | 4 |
| 4 | 5 | 4 | 5 |
| 5 | 5 | 4 | 5 |
| 6 | 5 | 5 | 6 |
| 7 | 7 | 5 | 6 |
| 8 | 7 | 6 | 7 |
| 9 | 7 | 6 | 7 |
| 10 | 7 | 7 | 8 |
| 11 | 7 | 7 | 8 |
| 12 | 7 | 8 | 9 |
| 13 | 7 | 8 | 9 |
| 14 | 7 | 9 | 10 |

The entropy and the bit rate are defined below:

$$\text{Bit rate} = \Sigma p_i * (\text{bits per symbol}) \quad (3)$$

$$\text{Bit rate} = \Sigma p_i * \log_2(1/p_i) \quad (4)$$

The values of entropy along with the bit rates for these codes are computed using equations (3) and (4) for different p (probability values with 15 symbols for every p of geometric distribution) are tabulated in the table below:

| p | Bit_Rate_ExpG | Bit_Rate_Rice | Bit_Rate Hybrid | Entropy |
|---|---|---|---|---|
| 0.1 | 3.7734 | 3.4349 | 3.7002 | 3.2549 |
| 0.15 | 3.9579 | 3.5498 | 3.8121 | 3.4032 |
| 0.2 | 3.7991 | 3.3829 | 3.6078 | 3.3127 |
| 0.25 | 3.5172 | 3.1425 | 3.3135 | 3.1186 |
| 0.3 | 3.2175 | 2.9115 | 3.0205 | 2.887 |
| 0.35 | 2.9364 | 2.7158 | 2.7588 | 2.65 |
| 0.4 | 2.6847 | 2.5578 | 2.5325 | 2.421 |
| 0.45 | 2.4623 | 2.4324 | 2.3372 | 2.2042 |
| 0.5 | 2.2654 | 2.333 | 2.1664 | 1.9995 |
| 0.55 | 2.0897 | 2.2539 | 2.0142 | 1.8049 |
| 0.6 | 1.9313 | 2.1905 | 1.8762 | 1.6182 |
| 0.65 | 1.787 | 2.1396 | 1.7489 | 1.437 |
| 0.7 | 1.6544 | 2.0989 | 1.6297 | 1.259 |
| 0.75 | 1.5314 | 2.0667 | 1.5167 | 1.0817 |
| 0.8 | 1.416 | 2.0417 | 1.4083 | 0.90241 |

-continued

| p | Bit_Rate_ExpG | Bit_Rate_Rice | Bit_Rate Hybrid | Entropy |
|---|---|---|---|---|
| 0.85 | 1.3068 | 2.023 | 1.3035 | 0.71746 |
| 0.9 | 1.202 | 2.0101 | 1.201 | 0.52111 |
| 0.95 | 1.1003 | 2.0025 | 1.1001 | 0.30147 |

Figure 8:
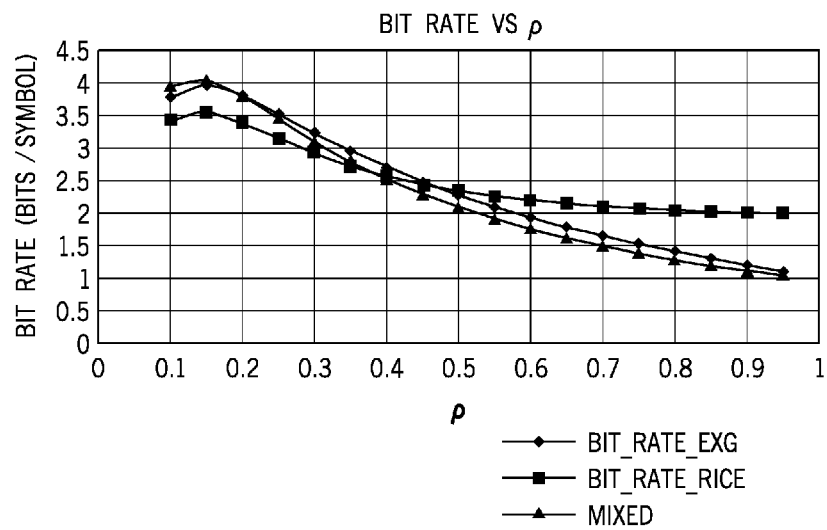
FIG. 8 is a plot of bit rate versus entropy for another embodiment.

The plot in FIG. 8 depicts the Bit Rate versus p, as we can see, for p<0.38, Rice encoding has least bit rate value, and p>0.38 the mixed encoding has least bit rate values.

The redundancy is defined as the difference between actual entropy and bit rate for various encodings. The redundancy values are tabulated in the table below:

| p | Entropy | Redundancy_ExpG | Redundancy_Rice | Redundancy_mixed |
|---|---|---|---|---|
| 0.1 | 3.2549 | 0.5185 | 0.18 | 0.6841 |
| 0.15 | 3.4032 | 0.5547 | 0.1466 | 0.6318 |
| 0.2 | 3.3127 | 0.4864 | 0.0702 | 0.475 |
| 0.25 | 3.1186 | 0.3986 | 0.0239 | 0.3231 |
| 0.3 | 2.887 | 0.3305 | 0.0245 | 0.2098 |
| 0.35 | 2.65 | 0.2864 | 0.0658 | 0.1367 |
| 0.4 | 2.421 | 0.2637 | 0.1368 | 0.0964 |
| 0.45 | 2.2042 | 0.2581 | 0.2282 | 0.0806 |
| 0.5 | 1.9995 | 0.2659 | 0.3335 | 0.0835 |
| 0.55 | 1.8049 | 0.2848 | 0.449 | 0.1015 |
| 0.6 | 1.6182 | 0.3131 | 0.5723 | 0.1323 |
| 0.65 | 1.437 | 0.35 | 0.7026 | 0.1751 |
| 0.7 | 1.259 | 0.3954 | 0.8399 | 0.2299 |
| 0.75 | 1.0817 | 0.4497 | 0.985 | 0.2975 |
| 0.8 | 0.90241 | 0.51359 | 1.13929 | 0.37929 |
| 0.85 | 0.71746 | 0.58934 | 1.30554 | 0.47804 |
| 0.9 | 0.52111 | 0.68089 | 1.48899 | 0.59899 |
| 0.95 | 0.30147 | 0.79883 | 1.70103 | 0.75353 |

Figure 9:
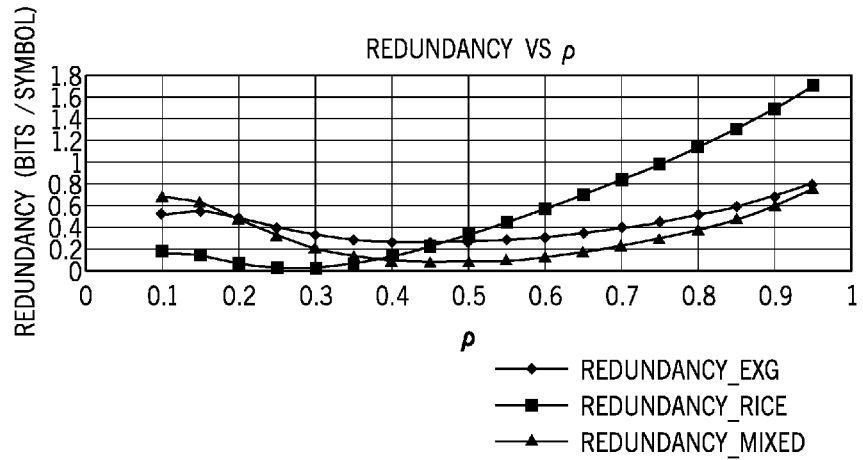
FIG. 9 is a plot of redundancy versus entropy for the another embodiment.

The corresponding plots are shown in FIG. 9. This plot corroborates the bit rate plot as shown above, for p>0.038 the mixed encoding has least redundancy and hence ideally suited for data encoding, whose symbols follow geometric distribution.

Figure 10:
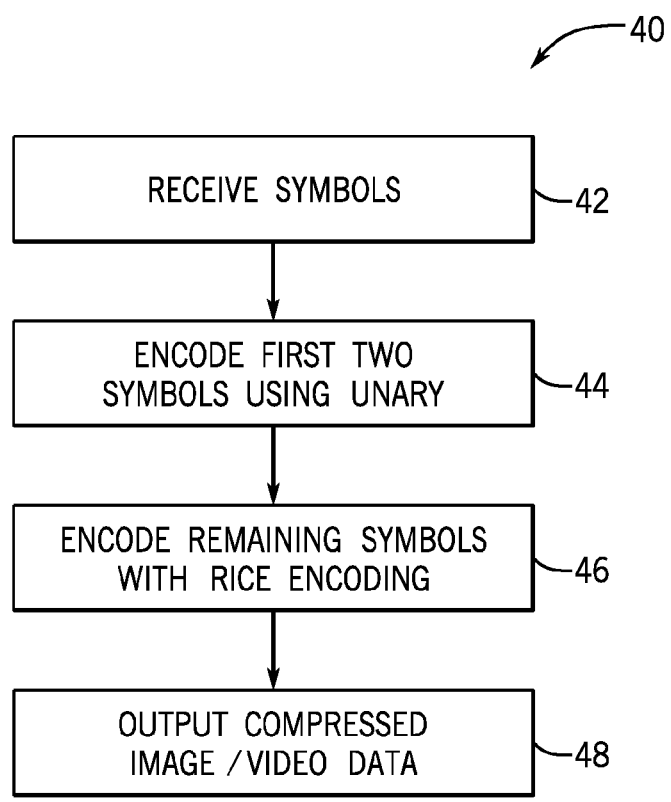
FIG. 10 is a flow chart for an encoding sequence the another embodiment.

Referring to FIG. 10, an encoding sequence 40 may be implemented in software, firmware and/or hardware. In software and firmware embodiments, it may be implemented by computer executed instructions stored in one or more non-transitory computer readable media such as magnetic, optical or semiconductor storage. In one embodiment, instructions may be stored in a storage which is integral to a graphics processing unit.

The sequence 40 begins by receiving symbols as indicated in block 42. The first two symbols are encoded using unary coding as indicated in block 44. The remaining symbols are encoded with Rice encoding as indicated in block 46. Then the compressed image/video data is output as indicated in block 48.

Figure 11:
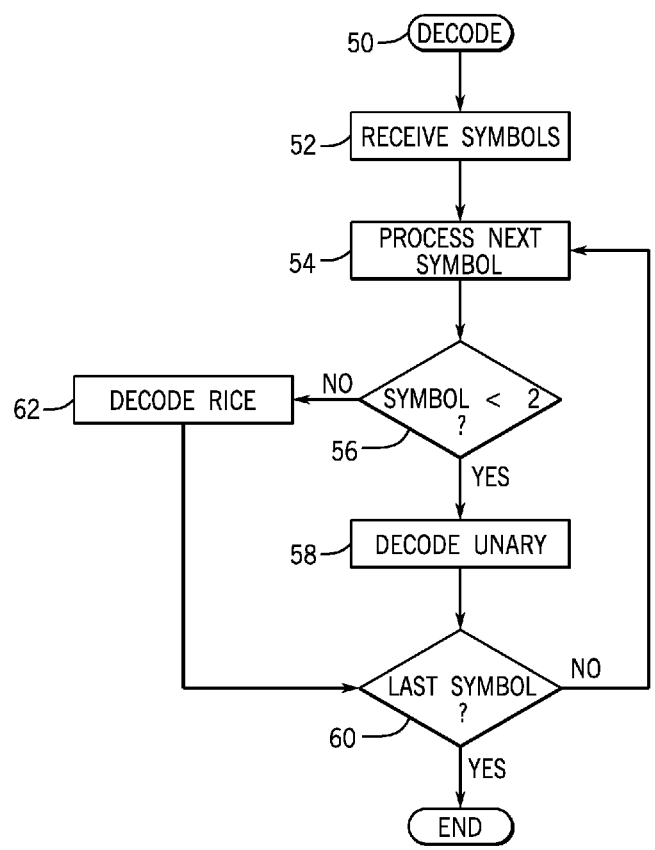
FIG. 11 is a flow chart for a decoding sequence for the another embodiment.

Referring to FIG. 11, a decoding sequence 50 may be implemented in software, firmware and/or hardware. In software and firmware embodiments, it may be implemented by computer executed instructions stored in one or more non-transitory computer readable media such as magnetic, optical or semiconductor storage. In one embodiment, instructions may be stored in a storage which is integral to a graphics processing unit.

The sequence 50 begins by receiving encoded symbols as indicated in block 52. At block 54 the next symbol is processed. A check at diamond 56 determines whether the symbol number is less than 2. If so, it is decoded using unary decoding as indicated in block 58. Then a check at diamond 60 determines if this is the last symbol.

If it is not the last symbol then the flow iterates back to block 54 to process the next symbol.

If the check at diamond 56 indicates that the symbol number is not less than two, then the symbol is decoded using Rice decoding as indicated in block 62. Then the flow goes to diamond 60 and either ends or if it is not the last symbol, iterates back to process the next symbol at block 54.

Figure 12:
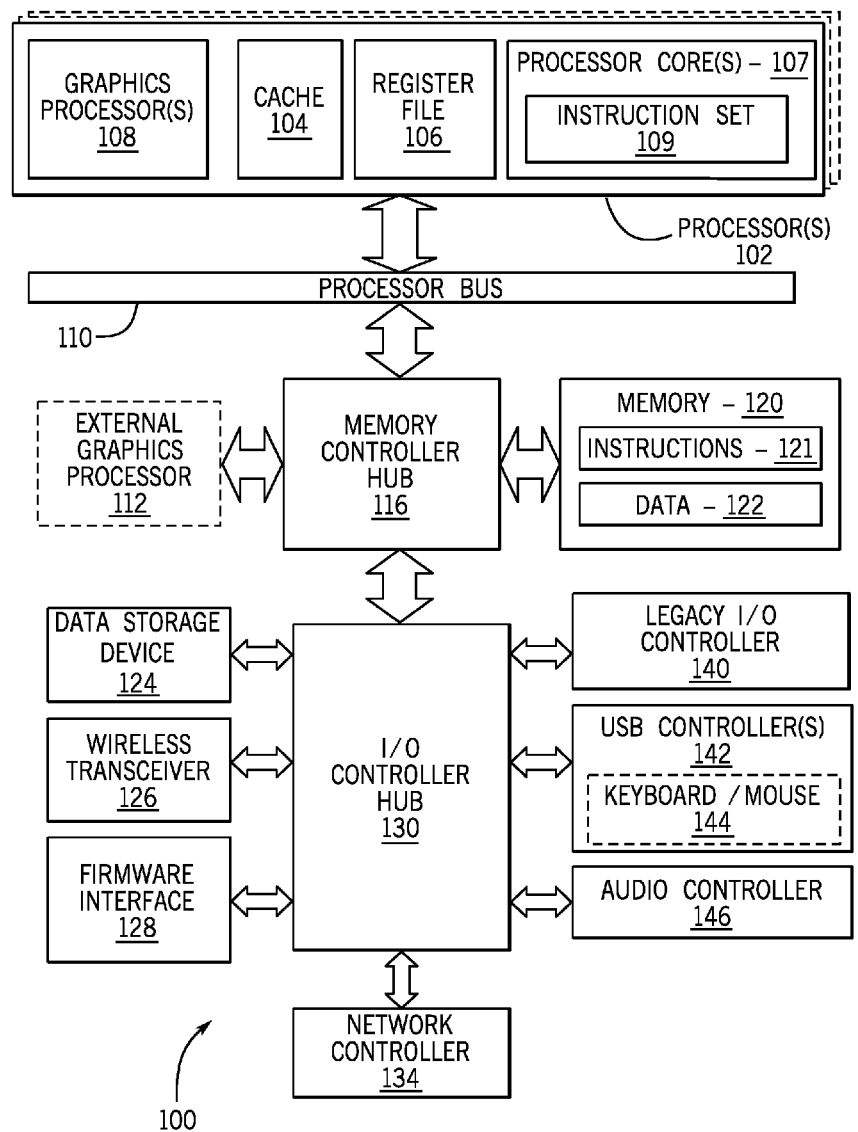
FIG. 12 is a block diagram of a processing system according to one embodiment.

FIG. 12 is a block diagram of a processing system 100, according to an embodiment. In various embodiments the system 100 includes one or more processors 102 and one or more graphics processors 108, and may be a single processor desktop system, a multiprocessor workstation system, or a server system having a large number of processors 102 or processor cores 107. In on embodiment, the system 100 is a processing platform incorporated within a system-on-a-chip (SoC) integrated circuit for use in mobile, handheld, or embedded devices.

An embodiment of system 100 can include, or be incorporated within a server-based gaming platform, a game console, including a game and media console, a mobile gaming console, a handheld game console, or an online game console. In some embodiments system 100 is a mobile phone, smart phone, tablet computing device or mobile Internet device. Data processing system 100 can also include, couple with, or be integrated within a wearable device, such as a smart watch wearable device, smart eyewear device, augmented reality device, or virtual reality device. In some embodiments, data processing system 100 is a television or set top box device having one or more processors 102 and a graphical interface generated by one or more graphics processors 108.

In some embodiments, the one or more processors 102 each include one or more processor cores 107 to process instructions which, when executed, perform operations for system and user software. In some embodiments, each of the one or more processor cores 107 is configured to process a specific instruction set 109. In some embodiments, instruction set 109 may facilitate Complex Instruction Set Computing (CISC), Reduced Instruction Set Computing (RISC), or computing via a Very Long Instruction Word (VLIW). Multiple processor cores 107 may each process a different instruction set 109, which may include instructions to facilitate the emulation of other instruction sets. Processor core 107 may also include other processing devices, such a Digital Signal Processor (DSP).

In some embodiments, the processor 102 includes cache memory 104. Depending on the architecture, the processor 102 can have a single internal cache or multiple levels of internal cache. In some embodiments, the cache memory is shared among various components of the processor 102. In some embodiments, the processor 102 also uses an external cache (e.g., a Level-3 (L3) cache or Last Level Cache (LLC)) (not shown), which may be shared among processor cores 107 using known cache coherency techniques. A register file 106 is additionally included in processor 102 which may include different types of registers for storing different types of data (e.g., integer registers, floating point registers, status registers, and an instruction pointer register). Some registers may be general-purpose registers, while other registers may be specific to the design of the processor 102.

In some embodiments, processor 102 is coupled to a processor bus 110 to transmit communication signals such as address, data, or control signals between processor 102 and other components in system 100. In one embodiment the system 100 uses an exemplary 'hub' system architecture, including a memory controller hub 116 and an Input Output (I/O) controller hub 130. A memory controller hub 116 facilitates communication between a memory device and other components of system 100, while an I/O Controller Hub (ICH) 130 provides connections to I/O devices via a local I/O bus. In one embodiment, the logic of the memory controller hub 116 is integrated within the processor.

Memory device 120 can be a dynamic random access memory (DRAM) device, a static random access memory (SRAM) device, flash memory device, phase-change memory device, or some other memory device having suitable performance to serve as process memory. In one embodiment the memory device 120 can operate as system memory for the system 100, to store data 122 and instructions 121 for use when the one or more processors 102 executes an application or process. Memory controller hub 116 also couples with an optional external graphics processor 112, which may communicate with the one or more graphics processors 108 in processors 102 to perform graphics and media operations.

In some embodiments, ICH 130 enables peripherals to connect to memory device 120 and processor 102 via a high-speed I/O bus. The I/O peripherals include, but are not limited to, an audio controller 146, a firmware interface 128, a wireless transceiver 126 (e.g., Wi-Fi, Bluetooth), a data storage device 124 (e.g., hard disk drive, flash memory, etc.), and a legacy I/O controller 140 for coupling legacy (e.g., Personal System 2 (PS/2)) devices to the system. One or more Universal Serial Bus (USB) controllers 142 connect input devices, such as keyboard and mouse 144 combinations. A network controller 134 may also couple to ICH 130. In some embodiments, a high-performance network controller (not shown) couples to processor bus 110. It will be appreciated that the system 100 shown is exemplary and not limiting, as other types of data processing systems that are differently configured may also be used. For example, the I/O controller hub 130 may be integrated within the one or more processor 102, or the memory controller hub 116 and I/O controller hub 130 may be integrated into a discreet external graphics processor, such as the external graphics processor 112.

Figure 13:
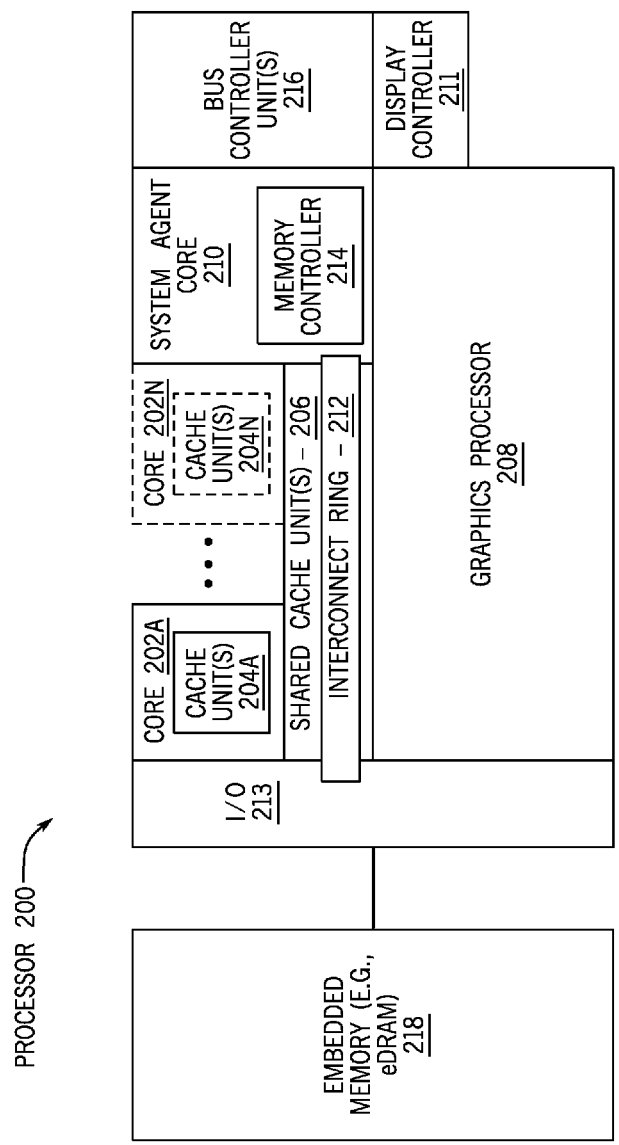
FIG. 13 is a block diagram of a processor according to one embodiment.

FIG. 13 is a block diagram of an embodiment of a processor 200 having one or more processor cores 202A-202N, an integrated memory controller 214, and an integrated graphics processor 208. Those elements of FIG. 13 having the same reference numbers (or names) as the elements of any other figure herein can operate or function in any manner similar to that described elsewhere herein, but are not limited to such. Processor 200 can include additional cores up to and including additional core 202N represented by the dashed lined boxes. Each of processor cores 202A-202N includes one or more internal cache units 204A-204N. In some embodiments each processor core also has access to one or more shared cached units 206.

The internal cache units 204A-204N and shared cache units 206 represent a cache memory hierarchy within the processor 200. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 206 and 204A-204N.

In some embodiments, processor 200 may also include a set of one or more bus controller units 216 and a system agent core 210. The one or more bus controller units 216 manage a set of peripheral buses, such as one or more Peripheral Component Interconnect buses (e.g., PCI, PCI Express). System agent core 210 provides management functionality for the various processor components. In some embodiments, system agent core 210 includes one or more integrated memory controllers 214 to manage access to various external memory devices (not shown).

In some embodiments, one or more of the processor cores 202A-202N include support for simultaneous multi-threading. In such embodiment, the system agent core 210 includes components for coordinating and operating cores 202A-202N during multi-threaded processing. System agent core 210 may additionally include a power control unit (PCU), which includes logic and components to regulate the power state of processor cores 202A-202N and graphics processor 208.

In some embodiments, processor 200 additionally includes graphics processor 208 to execute graphics processing operations. In some embodiments, the graphics processor 208 couples with the set of shared cache units 206, and the system agent core 210, including the one or more integrated memory controllers 214. In some embodiments, a display controller 211 is coupled with the graphics processor 208 to drive graphics processor output to one or more coupled displays. In some embodiments, display controller 211 may be a separate module coupled with the graphics processor via at least one interconnect, or may be integrated within the graphics processor 208 or system agent core 210.

In some embodiments, a ring based interconnect unit 212 is used to couple the internal components of the processor 200. However, an alternative interconnect unit may be used, such as a point-to-point interconnect, a switched interconnect, or other techniques, including techniques well known in the art. In some embodiments, graphics processor 208 couples with the ring interconnect 212 via an I/O link 213.

The exemplary I/O link 213 represents at least one of multiple varieties of I/O interconnects, including an on package I/O interconnect which facilitates communication between various processor components and a high-performance embedded memory module 218, such as an eDRAM module. In some embodiments, each of the processor cores 202-202N and graphics processor 208 use embedded memory modules 218 as a shared Last Level Cache.

In some embodiments, processor cores 202A-202N are homogenous cores executing the same instruction set architecture. In another embodiment, processor cores 202A-202N are heterogeneous in terms of instruction set architecture (ISA), where one or more of processor cores 202A-N execute a first instruction set, while at least one of the other cores executes a subset of the first instruction set or a different instruction set. In one embodiment processor cores 202A-202N are heterogeneous in terms of microarchitecture, where one or more cores having a relatively higher power consumption couple with one or more power cores having a lower power consumption. Additionally, processor 200 can be implemented on one or more chips or as an SoC integrated circuit having the illustrated components, in addition to other components.

Figure 14:
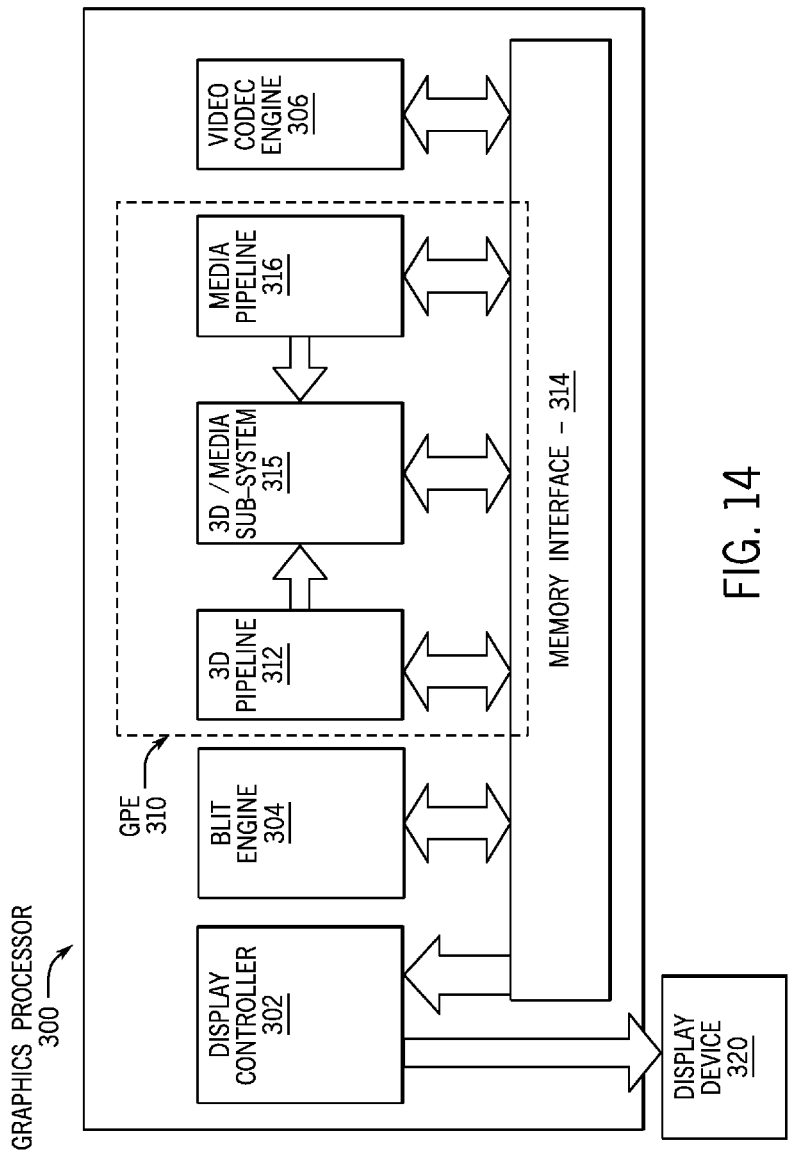
FIG. 14 is a block diagram of a graphics processor according to one embodiment.

FIG. 14 is a block diagram of a graphics processor 300, which may be a discrete graphics processing unit, or may be a graphics processor integrated with a plurality of processing cores. In some embodiments, the graphics processor communicates via a memory mapped I/O interface to registers on the graphics processor and with commands placed into the processor memory. In some embodiments, graphics processor 300 includes a memory interface 314 to access memory. Memory interface 314 can be an interface to local memory, one or more internal caches, one or more shared external caches, and/or to system memory.

In some embodiments, graphics processor 300 also includes a display controller 302 to drive display output data to a display device 320. Display controller 302 includes hardware for one or more overlay planes for the display and composition of multiple layers of video or user interface elements. In some embodiments, graphics processor 300 includes a video codec engine 306 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In some embodiments, graphics processor 300 includes a block image transfer (BLIT) engine 304 to perform two-dimensional (2D) rasterizer operations including, for example, bit-boundary block transfers. However, in one embodiment, 2D graphics operations are performed using one or more components of graphics processing engine (GPE) 310. In some embodiments, graphics processing engine 310 is a compute engine for performing graphics operations, including three-dimensional (3D) graphics operations and media operations.

In some embodiments, GPE 310 includes a 3D pipeline 312 for performing 3D operations, such as rendering three-dimensional images and scenes using processing functions that act upon 3D primitive shapes (e.g., rectangle, triangle, etc.). The 3D pipeline 312 includes programmable and fixed function elements that perform various tasks within the element and/or spawn execution threads to a 3D/Media sub-system 315. While 3D pipeline 312 can be used to perform media operations, an embodiment of GPE 310 also includes a media pipeline 316 that is specifically used to perform media operations, such as video post-processing and image enhancement.

In some embodiments, media pipeline 316 includes fixed function or programmable logic units to perform one or more specialized media operations, such as video decode acceleration, video de-interlacing, and video encode acceleration in place of, or on behalf of video codec engine 306. In some embodiments, media pipeline 316 additionally includes a thread spawning unit to spawn threads for execution on 3D/Media sub-system 315. The spawned threads perform computations for the media operations on one or more graphics execution units included in 3D/Media sub-system 315.

In some embodiments, 3D/Media subsystem 315 includes logic for executing threads spawned by 3D pipeline 312 and media pipeline 316. In one embodiment, the pipelines send thread execution requests to 3D/Media subsystem 315, which includes thread dispatch logic for arbitrating and dispatching the various requests to available thread execution resources. The execution resources include an array of graphics execution units to process the 3D and media threads. In some embodiments, 3D/Media subsystem 315 includes one or more internal caches for thread instructions and data. In some embodiments, the subsystem also includes shared memory, including registers and addressable memory, to share data between threads and to store output data.

Figure 15:
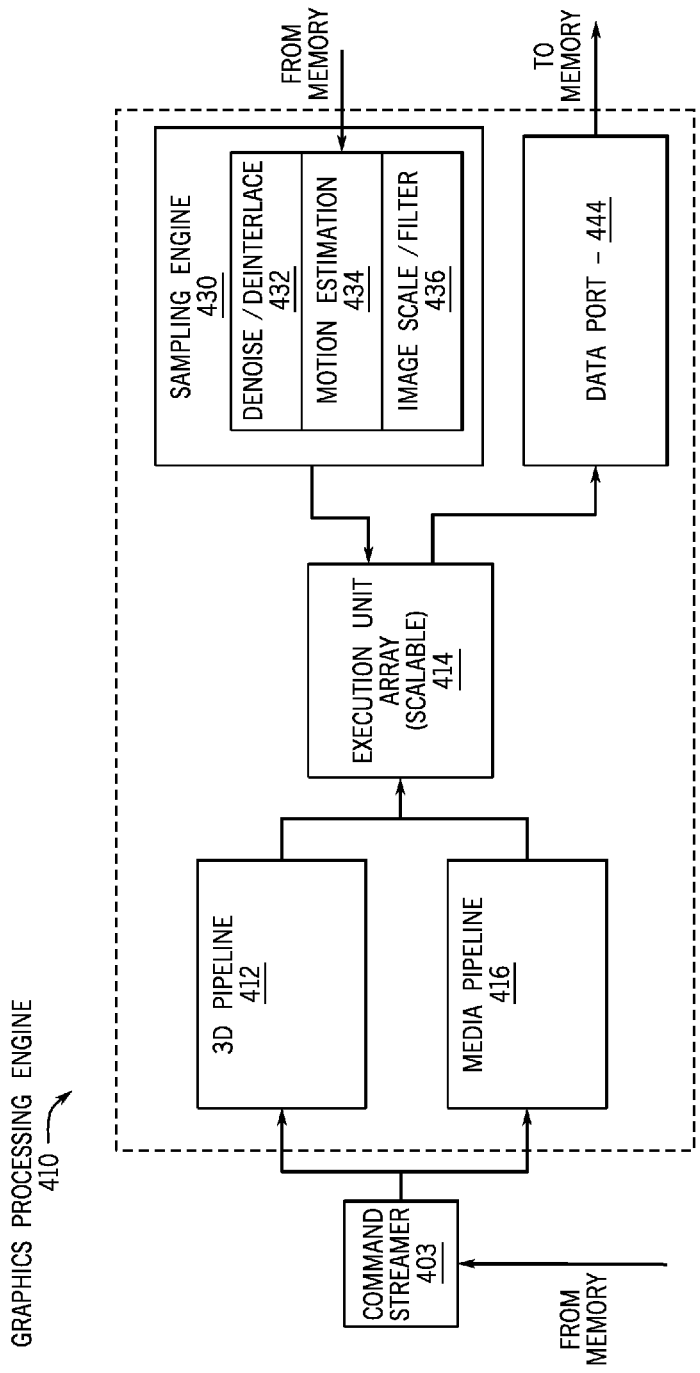
FIG. 15 is a block diagram of a graphics processing engine according to one embodiment.

FIG. 15 is a block diagram of a graphics processing engine 410 of a graphics processor in accordance with some embodiments. In one embodiment, the GPE 410 is a version of the GPE 310 shown in FIG. 14. Elements of FIG. 15 having the same reference numbers (or names) as the elements of any other figure herein can operate or function in any manner similar to that described elsewhere herein, but are not limited to such.

In some embodiments, GPE 410 couples with a command streamer 403, which provides a command stream to the GPE 3D and media pipelines 412, 416. In some embodiments, command streamer 403 is coupled to memory, which can be system memory, or one or more of internal cache memory and shared cache memory. In some embodiments, command streamer 403 receives commands from the memory and sends the commands to 3D pipeline 412 and/or media pipeline 416. The commands are directives fetched from a ring buffer, which stores commands for the 3D and media pipelines 412, 416. In one embodiment, the ring buffer can additionally include batch command buffers storing batches of multiple commands. The 3D and media pipelines 412, 416 process the commands by performing operations via logic within the respective pipelines or by dispatching one or more execution threads to an execution unit array 414. In some embodiments, execution unit array 414 is scalable, such that the array includes a variable number of execution units based on the target power and performance level of GPE 410.

In some embodiments, a sampling engine 430 couples with memory (e.g., cache memory or system memory) and execution unit array 414. In some embodiments, sampling engine 430 provides a memory access mechanism for execution unit array 414 that allows execution array 414 to read graphics and media data from memory. In some embodiments, sampling engine 430 includes logic to perform specialized image sampling operations for media.

In some embodiments, the specialized media sampling logic in sampling engine 430 includes a de-noise/de-interlace module 432, a motion estimation module 434, and an image scaling and filtering module 436. In some embodiments, de-noise/de-interlace module 432 includes logic to perform one or more of a de-noise or a de-interlace algorithm on decoded video data. The de-interlace logic combines alternating fields of interlaced video content into a single fame of video. The de-noise logic reduces or removes data noise from video and image data. In some embodiments, the de-noise logic and de-interlace logic are motion adaptive and use spatial or temporal filtering based on the amount of motion detected in the video data. In some embodiments, the de-noise/de-interlace module 432 includes dedicated motion detection logic (e.g., within the motion estimation engine 434).

In some embodiments, motion estimation engine 434 provides hardware acceleration for video operations by performing video acceleration functions such as motion vector estimation and prediction on video data. The motion estimation engine determines motion vectors that describe the transformation of image data between successive video frames. In some embodiments, a graphics processor media codec uses video motion estimation engine 434 to perform operations on video at the macro-block level that may otherwise be too computationally intensive to perform with a general-purpose processor. In some embodiments, motion estimation engine 434 is generally available to graphics processor components to assist with video decode and processing functions that are sensitive or adaptive to the direction or magnitude of the motion within video data.

In some embodiments, image scaling and filtering module 436 performs image-processing operations to enhance the visual quality of generated images and video. In some embodiments, scaling and filtering module 436 processes image and video data during the sampling operation before providing the data to execution unit array 414.

In some embodiments, the GPE 410 includes a data port 444, which provides an additional mechanism for graphics subsystems to access memory. In some embodiments, data port 444 facilitates memory access for operations including render target writes, constant buffer reads, scratch memory space reads/writes, and media surface accesses. In some embodiments, data port 444 includes cache memory space to cache accesses to memory. The cache memory can be a single data cache or separated into multiple caches for the multiple subsystems that access memory via the data port (e.g., a render buffer cache, a constant buffer cache, etc.). In some embodiments, threads executing on an execution unit in execution unit array 414 communicate with the data port by exchanging messages via a data distribution interconnect that couples each of the sub-systems of GPE 410.

Figure 16:
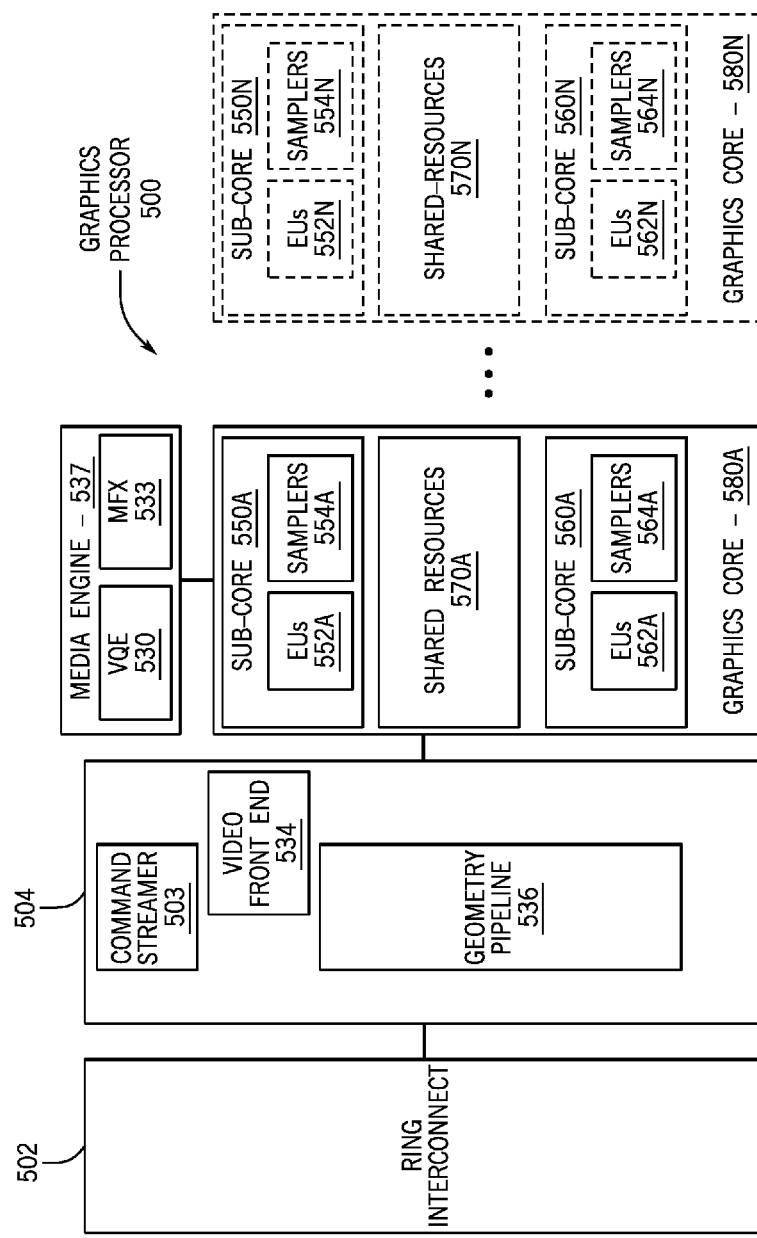
FIG. 16 is a block diagram of another embodiment of a graphics processor.

FIG. 16 is a block diagram of another embodiment of a graphics processor 500. Elements of FIG. 16 having the same reference numbers (or names) as the elements of any other figure herein can operate or function in any manner similar to that described elsewhere herein, but are not limited to such.

In some embodiments, graphics processor 500 includes a ring interconnect 502, a pipeline front-end 504, a media engine 537, and graphics cores 580A-580N. In some embodiments, ring interconnect 502 couples the graphics processor to other processing units, including other graphics processors or one or more general-purpose processor cores. In some embodiments, the graphics processor is one of many processors integrated within a multi-core processing system.

In some embodiments, graphics processor 500 receives batches of commands via ring interconnect 502. The incoming commands are interpreted by a command streamer 503 in the pipeline front-end 504. In some embodiments, graphics processor 500 includes scalable execution logic to perform 3D geometry processing and media processing via the graphics core(s) 580A-580N. For 3D geometry processing commands, command streamer 503 supplies commands to geometry pipeline 536. For at least some media processing commands, command streamer 503 supplies the commands to a video front end 534, which couples with a media engine 537. In some embodiments, media engine 537 includes a Video Quality Engine (VQE) 530 for video and image post-processing and a multi-format encode/decode (MFX) 533 engine to provide hardware-accelerated media data encode and decode. In some embodiments, geometry pipeline 536 and media engine 537 each generate execution threads for the thread execution resources provided by at least one graphics core 580A.

In some embodiments, graphics processor 500 includes scalable thread execution resources featuring modular cores 580A-580N (sometimes referred to as core slices), each having multiple sub-cores 550A-550N, 560A-560N (sometimes referred to as core sub-slices). In some embodiments, graphics processor 500 can have any number of graphics cores 580A through 580N. In some embodiments, graphics processor 500 includes a graphics core 580A having at least a first sub-core 550A and a second core sub-core 560A. In other embodiments, the graphics processor is a low power processor with a single sub-core (e.g., 550A). In some embodiments, graphics processor 500 includes multiple graphics cores 580A-580N, each including a set of first sub-cores 550A-550N and a set of second sub-cores 560A-560N. Each sub-core in the set of first sub-cores 550A-550N includes at least a first set of execution units 552A-552N and media/texture samplers 554A-554N. Each sub-core in the set of second sub-cores 560A-560N includes at least a second set of execution units 562A-562N and samplers 564A-564N. In some embodiments, each sub-core 550A-550N, 560A-560N shares a set of shared resources 570A-570N. In some embodiments, the shared resources include shared cache memory and pixel operation logic. Other shared resources may also be included in the various embodiments of the graphics processor.

Figure 17:
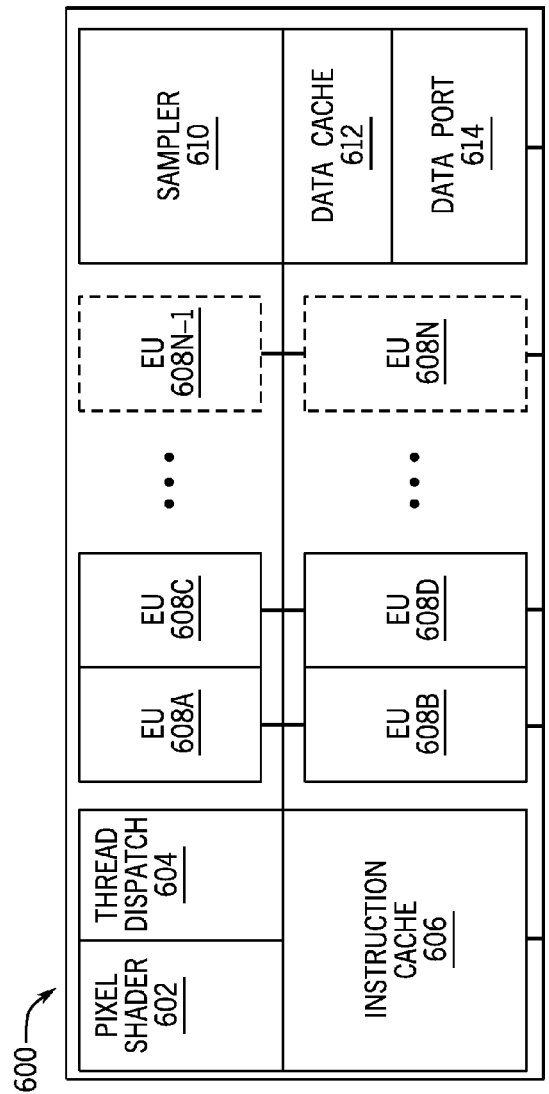
FIG. 17 is a depiction of thread execution logic according to one embodiment.

FIG. 17 illustrates thread execution logic 600 including an array of processing elements employed in some embodiments of a GPE. Elements of FIG. 17 having the same reference numbers (or names) as the elements of any other figure herein can operate or function in any manner similar to that described elsewhere herein, but are not limited to such.

In some embodiments, thread execution logic 600 includes a pixel shader 602, a thread dispatcher 604, instruction cache 606, a scalable execution unit array including a plurality of execution units 608A-608N, a sampler 610, a data cache 612, and a data port 614. In one embodiment the included components are interconnected via an interconnect fabric that links to each of the components. In some embodiments, thread execution logic 600 includes one or more connections to memory, such as system memory or cache memory, through one or more of instruction cache 606, data port 614, sampler 610, and execution unit array 608A-608N. In some embodiments, each execution unit (e.g. 608A) is an individual vector processor capable of executing multiple simultaneous threads and processing multiple data elements in parallel for each thread. In some embodiments, execution unit array 608A-608N includes any number individual execution units.

In some embodiments, execution unit array 608A-608N is primarily used to execute "shader" programs. In some embodiments, the execution units in array 608A-608N execute an instruction set that includes native support for many standard 3D graphics shader instructions, such that shader programs from graphics libraries (e.g., Direct 3D and OpenGL) are executed with a minimal translation. The execution units support vertex and geometry processing (e.g., vertex programs, geometry programs, vertex shaders), pixel processing (e.g., pixel shaders, fragment shaders) and general-purpose processing (e.g., compute and media shaders).

Each execution unit in execution unit array 608A-608N operates on arrays of data elements. The number of data elements is the "execution size," or the number of channels for the instruction. An execution channel is a logical unit of execution for data element access, masking, and flow control within instructions. The number of channels may be independent of the number of physical Arithmetic Logic Units (ALUs) or Floating Point Units (FPUs) for a particular graphics processor. In some embodiments, execution units 608A-608N support integer and floating-point data types.

The execution unit instruction set includes single instruction multiple data (SIMD) instructions. The various data elements can be stored as a packed data type in a register and the execution unit will process the various elements based on the data size of the elements. For example, when operating on a 256-bit wide vector, the 256 bits of the vector are stored in a register and the execution unit operates on the vector as four separate 64-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, different vector widths and register sizes are possible.

One or more internal instruction caches (e.g., 606) are included in the thread execution logic 600 to cache thread instructions for the execution units. In some embodiments, one or more data caches (e.g., 612) are included to cache thread data during thread execution. In some embodiments, sampler 610 is included to provide texture sampling for 3D operations and media sampling for media operations. In some embodiments, sampler 610 includes specialized texture or media sampling functionality to process texture or media data during the sampling process before providing the sampled data to an execution unit.

During execution, the graphics and media pipelines send thread initiation requests to thread execution logic 600 via a thread spawning and dispatch logic. In some embodiments, thread execution logic 600 includes a local thread dispatcher 604 that arbitrates thread initiation requests from the graphics and media pipelines and instantiates the requested threads on one or more execution units 608A-608N. For example, the geometry pipeline (e.g., 536 of FIG. 16) dispatches vertex processing, tessellation, or geometry processing threads to thread execution logic 600 (FIG. 17). In some embodiments, thread dispatcher 604 can also process runtime thread spawning requests from the executing shader programs.

Once a group of geometric objects has been processed and rasterized into pixel data, pixel shader 602 is invoked to further compute output information and cause results to be written to output surfaces (e.g., color buffers, depth buffers, stencil buffers, etc.). In some embodiments, pixel shader 602 calculates the values of the various vertex attributes that are to be interpolated across the rasterized object. In some embodiments, pixel shader 602 then executes an application programming interface (API)-supplied pixel shader program. To execute the pixel shader program, pixel shader 602 dispatches threads to an execution unit (e.g., 608A) via thread dispatcher 604. In some embodiments, pixel shader 602 uses texture sampling logic in sampler 610 to access texture data in texture maps stored in memory. Arithmetic operations on the texture data and the input geometry data compute pixel color data for each geometric fragment, or discards one or more pixels from further processing.

In some embodiments, the data port 614 provides a memory access mechanism for the thread execution logic 600 output processed data to memory for processing on a graphics processor output pipeline. In some embodiments, the data port 614 includes or couples to one or more cache memories (e.g., data cache 612) to cache data for memory access via the data port.

Figure 18:
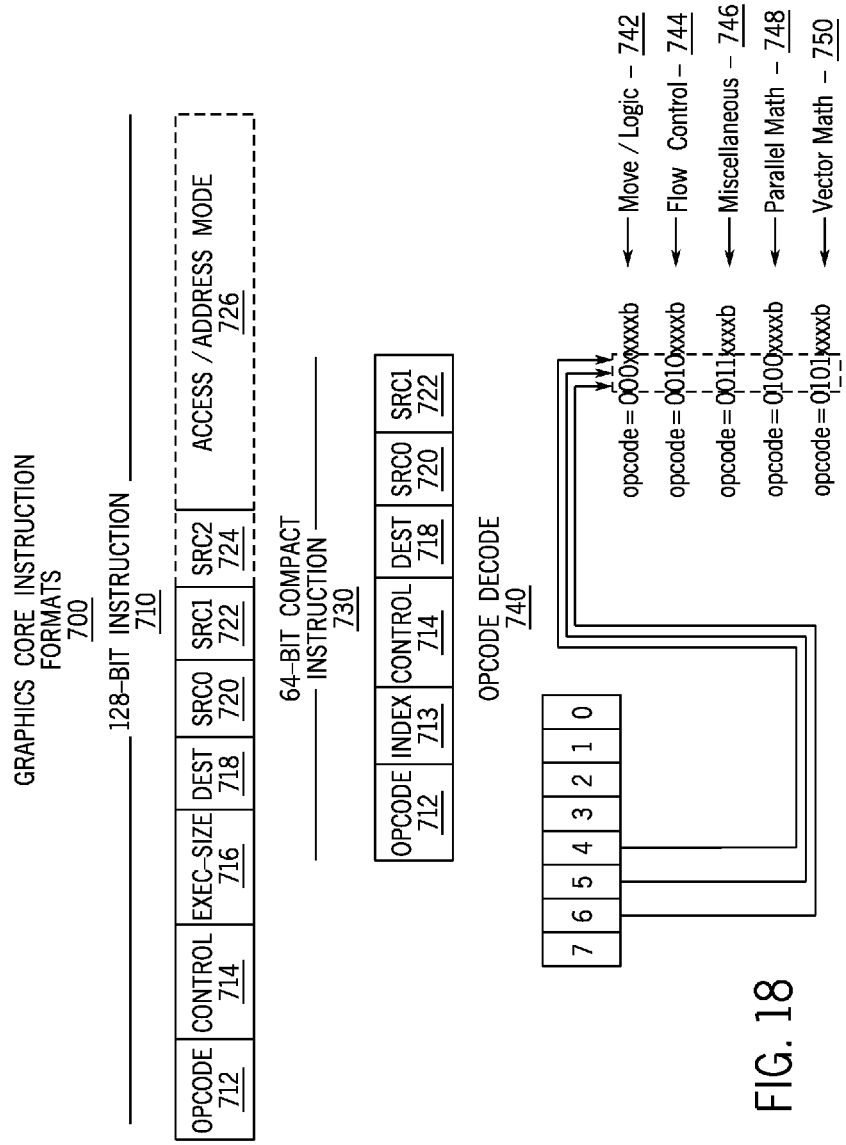
FIG. 18 is a block diagram of a graphics processor instruction format according to some embodiments.

FIG. 18 is a block diagram illustrating a graphics processor instruction formats 700 according to some embodiments. In one or more embodiment, the graphics processor execution units support an instruction set having instructions in multiple formats. The solid lined boxes illustrate the components that are generally included in an execution unit instruction, while the dashed lines include components that are optional or that are only included in a sub-set of the instructions. In some embodiments, instruction format 700 described and illustrated are macro-instructions, in that they are instructions supplied to the execution unit, as opposed to micro-operations resulting from instruction decode once the instruction is processed.

In some embodiments, the graphics processor execution units natively support instructions in a 128-bit format 710. A 64-bit compacted instruction format 730 is available for some instructions based on the selected instruction, instruction options, and number of operands. The native 128-bit format 710 provides access to all instruction options, while some options and operations are restricted in the 64-bit format 730. The native instructions available in the 64-bit format 730 vary by embodiment. In some embodiments, the instruction is compacted in part using a set of index values in an index field 713. The execution unit hardware references a set of compaction tables based on the index values and uses the compaction table outputs to reconstruct a native instruction in the 128-bit format 710.

For each format, instruction opcode 712 defines the operation that the execution unit is to perform. The execution units execute each instruction in parallel across the multiple data elements of each operand. For example, in response to an add instruction the execution unit performs a simultaneous add operation across each color channel representing a texture element or picture element. By default, the execution unit performs each instruction across all data channels of the operands. In some embodiments, instruction control field 714 enables control over certain execution options, such as channels selection (e.g., predication) and data channel order (e.g., swizzle). For 128-bit instructions 710 an exec-size field 716 limits the number of data channels that will be executed in parallel. In some embodiments, exec-size field 716 is not available for use in the 64-bit compact instruction format 730.

Some execution unit instructions have up to three operands including two source operands, src0 722, src1 722, and one destination 718. In some embodiments, the execution units support dual destination instructions, where one of the destinations is implied. Data manipulation instructions can have a third source operand (e.g., SRC2 724), where the instruction opcode 712 determines the number of source operands. An instruction's last source operand can be an immediate (e.g., hard-coded) value passed with the instruction.

In some embodiments, the 128-bit instruction format 710 includes an access/address mode information 726 specifying, for example, whether direct register addressing mode or indirect register addressing mode is used. When direct register addressing mode is used, the register address of one or more operands is directly provided by bits in the instruction 710.

In some embodiments, the 128-bit instruction format 710 includes an access/address mode field 726, which specifies an address mode and/or an access mode for the instruction. In one embodiment the access mode to define a data access alignment for the instruction. Some embodiments support access modes including a 16-byte aligned access mode and a 1-byte aligned access mode, where the byte alignment of the access mode determines the access alignment of the instruction operands. For example, when in a first mode, the instruction 710 may use byte-aligned addressing for source and destination operands and when in a second mode, the instruction 710 may use 16-byte-aligned addressing for all source and destination operands.

In one embodiment, the address mode portion of the access/address mode field 726 determines whether the instruction is to use direct or indirect addressing. When direct register addressing mode is used bits in the instruction 710 directly provide the register address of one or more operands. When indirect register addressing mode is used, the register address of one or more operands may be computed based on an address register value and an address immediate field in the instruction.

In some embodiments instructions are grouped based on opcode 712 bit-fields to simplify Opcode decode 740. For an 8-bit opcode, bits 4, 5, and 6 allow the execution unit to determine the type of opcode. The precise opcode grouping shown is merely an example. In some embodiments, a move and logic opcode group 742 includes data movement and logic instructions (e.g., move (mov), compare (cmp)). In some embodiments, move and logic group 742 shares the five most significant bits (MSB), where move (mov) instructions are in the form of 0000xxxxb and logic instructions are in the form of 0001xxxxb. A flow control instruction group 744 (e.g., call, jump (jmp)) includes instructions in the form of 0010xxxxb (e.g., 0x20). A miscellaneous instruction group 746 includes a mix of instructions, including synchronization instructions (e.g., wait, send) in the form of 0011xxxxb (e.g., 0x30). A parallel math instruction group 748 includes component-wise arithmetic instructions (e.g., add, multiply (mul)) in the form of 0100xxxxb (e.g., 0x40). The parallel math group 748 performs the arithmetic operations in parallel across data channels. The vector math group 750 includes arithmetic instructions (e.g., dp4) in the form of 0101xxxxb (e.g., 0x50). The vector math group performs arithmetic such as dot product calculations on vector operands.

FIG. 19 is a block diagram of another embodiment of a graphics processor 800. Elements of FIG. 19 having the same reference numbers (or names) as the elements of any other figure herein can operate or function in any manner similar to that described elsewhere herein, but are not limited to such.

In some embodiments, graphics processor 800 includes a graphics pipeline 820, a media pipeline 830, a display engine 840, thread execution logic 850, and a render output pipeline 870. In some embodiments, graphics processor 800 is a graphics processor within a multi-core processing system that includes one or more general purpose processing cores. The graphics processor is controlled by register writes to one or more control registers (not shown) or via commands issued to graphics processor 800 via a ring interconnect 802. In some embodiments, ring interconnect 802 couples graphics processor 800 to other processing components, such as other graphics processors or general-purpose processors. Commands from ring interconnect 802 are interpreted by a command streamer 803, which supplies instructions to individual components of graphics pipeline 820 or media pipeline 830.

In some embodiments, command streamer 803 directs the operation of a vertex fetcher 805 that reads vertex data from memory and executes vertex-processing commands provided by command streamer 803. In some embodiments, vertex fetcher 805 provides vertex data to a vertex shader 807, which performs coordinate space transformation and lighting operations to each vertex. In some embodiments, vertex fetcher 805 and vertex shader 807 execute vertex-processing instructions by dispatching execution threads to execution units 852A, 852B via a thread dispatcher 831.

In some embodiments, execution units 852A, 852B are an array of vector processors having an instruction set for performing graphics and media operations. In some embodiments, execution units 852A, 852B have an attached L1 cache 851 that is specific for each array or shared between the arrays. The cache can be configured as a data cache, an instruction cache, or a single cache that is partitioned to contain data and instructions in different partitions.

In some embodiments, graphics pipeline 820 includes tessellation components to perform hardware-accelerated tessellation of 3D objects. In some embodiments, a programmable hull shader 811 configures the tessellation operations. A programmable domain shader 817 provides back-end evaluation of tessellation output. A tessellator 813 operates at the direction of hull shader 811 and contains special purpose logic to generate a set of detailed geometric objects based on a coarse geometric model that is provided as input to graphics pipeline 820. In some embodiments, if tessellation is not used, tessellation components 811, 813, 817 can be bypassed.

In some embodiments, complete geometric objects can be processed by a geometry shader 819 via one or more threads dispatched to execution units 852A, 852B, or can proceed directly to the clipper 829. In some embodiments, the geometry shader operates on entire geometric objects, rather than vertices or patches of vertices as in previous stages of the graphics pipeline. If the tessellation is disabled the geometry shader 819 receives input from the vertex shader 807. In some embodiments, geometry shader 819 is programmable by a geometry shader program to perform geometry tessellation if the tessellation units are disabled.

Before rasterization, a clipper 829 processes vertex data. The clipper 829 may be a fixed function clipper or a programmable clipper having clipping and geometry shader functions. In some embodiments, a rasterizer/depth 873 in the render output pipeline 870 dispatches pixel shaders to convert the geometric objects into their per pixel representations. In some embodiments, pixel shader logic is included in thread execution logic 850. In some embodiments, an application can bypass the rasterizer 873 and access unrasterized vertex data via a stream out unit 823.

The graphics processor 800 has an interconnect bus, interconnect fabric, or some other interconnect mechanism that allows data and message passing amongst the major components of the processor. In some embodiments, execution units 852A, 852B and associated cache(s) 851, texture and media sampler 854, and texture/sampler cache 858 interconnect via a data port 856 to perform memory access and communicate with render output pipeline components of the processor. In some embodiments, sampler 854, caches 851, 858 and execution units 852A, 852B each have separate memory access paths.

In some embodiments, render output pipeline 870 contains a rasterizer and depth test component 873 that converts vertex-based objects into an associated pixel-based representation. In some embodiments, the rasterizer logic includes a windower/masker unit to perform fixed function triangle and line rasterization. An associated render cache 878 and depth cache 879 are also available in some embodiments. A pixel operations component 877 performs pixel-based operations on the data, though in some instances, pixel operations associated with 2D operations (e.g. bit block image transfers with blending) are performed by the 2D engine 841, or substituted at display time by the display controller 843 using overlay display planes. In some embodiments, a shared L3 cache 875 is available to all graphics components, allowing the sharing of data without the use of main system memory.

In some embodiments, graphics processor media pipeline 830 includes a media engine 837 and a video front end 834. In some embodiments, video front end 834 receives pipeline commands from the command streamer 803. In some embodiments, media pipeline 830 includes a separate command streamer. In some embodiments, video front-end 834 processes media commands before sending the command to the media engine 837. In some embodiments, media engine 337 includes thread spawning functionality to spawn threads for dispatch to thread execution logic 850 via thread dispatcher 831.

In some embodiments, graphics processor 800 includes a display engine 840. In some embodiments, display engine 840 is external to processor 800 and couples with the graphics processor via the ring interconnect 802, or some other interconnect bus or fabric. In some embodiments, display engine 840 includes a 2D engine 841 and a display controller 843. In some embodiments, display engine 840 contains special purpose logic capable of operating independently of the 3D pipeline. In some embodiments, display controller 843 couples with a display device (not shown), which may be a system integrated display device, as in a laptop computer, or an external display device attached via a display device connector.

In some embodiments, graphics pipeline 820 and media pipeline 830 are configurable to perform operations based on multiple graphics and media programming interfaces and are not specific to any one application programming interface (API). In some embodiments, driver software for the graphics processor translates API calls that are specific to a particular graphics or media library into commands that can be processed by the graphics processor. In some embodiments, support is provided for the Open Graphics Library (OpenGL) and Open Computing Language (OpenCL) from the Khronos Group, the Direct3D library from the Microsoft Corporation, or support may be provided to both OpenGL and D3D. Support may also be provided for the Open Source Computer Vision Library (OpenCV). A future API with a compatible 3D pipeline would also be supported if a mapping can be made from the pipeline of the future API to the pipeline of the graphics processor.

Figure 20A:
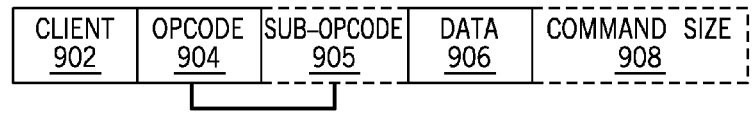
FIG. 20A is a block diagram of a graphics processor command format according to some embodiments.
Figure 20B:
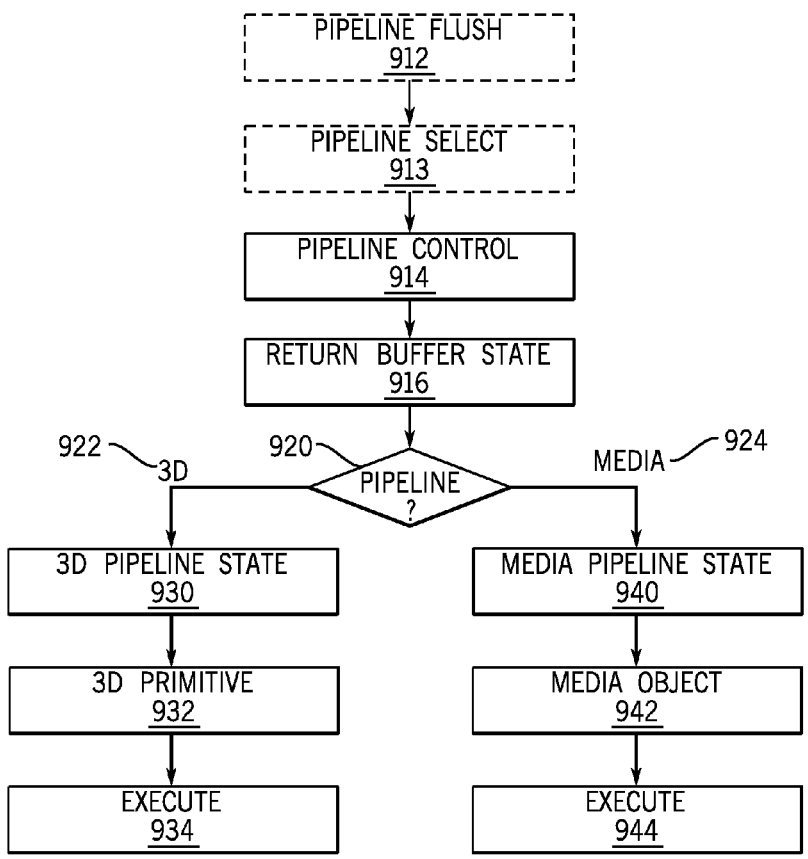
FIG. 20B is a block diagram illustrating a graphics processor command sequence according to some embodiments.

FIG. 20A is a block diagram illustrating a graphics processor command format 900 according to some embodiments. FIG. 20B is a block diagram illustrating a graphics processor command sequence 910 according to an embodiment. The solid lined boxes in FIG. 20A illustrate the components that are generally included in a graphics command while the dashed lines include components that are optional or that are only included in a sub-set of the graphics commands. The exemplary graphics processor command format 900 of FIG. 20A includes data fields to identify a target client 902 of the command, a command operation code (opcode) 904, and the relevant data 906 for the command. A sub-opcode 905 and a command size 908 are also included in some commands.

In some embodiments, client 902 specifies the client unit of the graphics device that processes the command data. In some embodiments, a graphics processor command parser examines the client field of each command to condition the further processing of the command and route the command data to the appropriate client unit. In some embodiments, the graphics processor client units include a memory interface unit, a render unit, a 2D unit, a 3D unit, and a media unit. Each client unit has a corresponding processing pipeline that processes the commands. Once the command is received by the client unit, the client unit reads the opcode 904 and, if present, sub-opcode 905 to determine the operation to perform. The client unit performs the command using information in data field 906. For some commands an explicit command size 908 is expected to specify the size of the command. In some embodiments, the command parser automatically determines the size of at least some of the commands based on the command opcode. In some embodiments commands are aligned via multiples of a double word.

The flow diagram in FIG. 20B shows an exemplary graphics processor command sequence 910. In some embodiments, software or firmware of a data processing system that features an embodiment of a graphics processor uses a version of the command sequence shown to set up, execute, and terminate a set of graphics operations. A sample command sequence is shown and described for purposes of example only as embodiments are not limited to these specific commands or to this command sequence. Moreover, the commands may be issued as batch of commands in a command sequence, such that the graphics processor will process the sequence of commands in at least partially concurrence.

In some embodiments, the graphics processor command sequence 910 may begin with a pipeline flush command 912 to cause any active graphics pipeline to complete the currently pending commands for the pipeline. In some embodiments, the 3D pipeline 922 and the media pipeline 924 do not operate concurrently. The pipeline flush is performed to cause the active graphics pipeline to complete any pending commands. In response to a pipeline flush, the command parser for the graphics processor will pause command processing until the active drawing engines complete pending operations and the relevant read caches are invalidated. Optionally, any data in the render cache that is marked 'dirty' can be flushed to memory. In some embodiments, pipeline flush command 912 can be used for pipeline synchronization or before placing the graphics processor into a low power state.

In some embodiments, a pipeline select command 913 is used when a command sequence requires the graphics processor to explicitly switch between pipelines. In some embodiments, a pipeline select command 913 is required only once within an execution context before issuing pipeline commands unless the context is to issue commands for both pipelines. In some embodiments, a pipeline flush command is 912 is required immediately before a pipeline switch via the pipeline select command 913.

In some embodiments, a pipeline control command 914 configures a graphics pipeline for operation and is used to program the 3D pipeline 922 and the media pipeline 924. In some embodiments, pipeline control command 914 configures the pipeline state for the active pipeline. In one embodiment, the pipeline control command 914 is used for pipeline synchronization and to clear data from one or more cache memories within the active pipeline before processing a batch of commands.

In some embodiments, return buffer state commands 916 are used to configure a set of return buffers for the respective pipelines to write data. Some pipeline operations require the allocation, selection, or configuration of one or more return buffers into which the operations write intermediate data during processing. In some embodiments, the graphics processor also uses one or more return buffers to store output data and to perform cross thread communication. In some embodiments, the return buffer state 916 includes selecting the size and number of return buffers to use for a set of pipeline operations.

The remaining commands in the command sequence differ based on the active pipeline for operations. Based on a pipeline determination 920, the command sequence is tailored to the 3D pipeline 922 beginning with the 3D pipeline state 930, or the media pipeline 924 beginning at the media pipeline state 940.

The commands for the 3D pipeline state 930 include 3D state setting commands for vertex buffer state, vertex element state, constant color state, depth buffer state, and other state variables that are to be configured before 3D primitive commands are processed. The values of these commands are determined at least in part based the particular 3D API in use. In some embodiments, 3D pipeline state 930 commands are also able to selectively disable or bypass certain pipeline elements if those elements will not be used.

In some embodiments, 3D primitive 932 command is used to submit 3D primitives to be processed by the 3D pipeline. Commands and associated parameters that are passed to the graphics processor via the 3D primitive 932 command are forwarded to the vertex fetch function in the graphics pipeline. The vertex fetch function uses the 3D primitive 932 command data to generate vertex data structures. The vertex data structures are stored in one or more return buffers. In some embodiments, 3D primitive 932 command is used to perform vertex operations on 3D primitives via vertex shaders. To process vertex shaders, 3D pipeline 922 dispatches shader execution threads to graphics processor execution units.

In some embodiments, 3D pipeline 922 is triggered via an execute 934 command or event. In some embodiments, a register write triggers command execution. In some embodiments execution is triggered via a 'go' or 'kick' command in the command sequence. In one embodiment command execution is triggered using a pipeline synchronization command to flush the command sequence through the graphics pipeline. The 3D pipeline will perform geometry processing for the 3D primitives. Once operations are complete, the resulting geometric objects are rasterized and the pixel engine colors the resulting pixels. Additional commands to control pixel shading and pixel back end operations may also be included for those operations.

In some embodiments, the graphics processor command sequence 910 follows the media pipeline 924 path when performing media operations. In general, the specific use and manner of programming for the media pipeline 924 depends on the media or compute operations to be performed. Specific media decode operations may be offloaded to the media pipeline during media decode. In some embodiments, the media pipeline can also be bypassed and media decode can be performed in whole or in part using resources provided by one or more general purpose processing cores. In one embodiment, the media pipeline also includes elements for general-purpose graphics processor unit (GPGPU) operations, where the graphics processor is used to perform SIMD vector operations using computational shader programs that are not explicitly related to the rendering of graphics primitives.

In some embodiments, media pipeline 924 is configured in a similar manner as the 3D pipeline 922. A set of media pipeline state commands 940 are dispatched or placed into in a command queue before the media object commands 942. In some embodiments, media pipeline state commands 940 include data to configure the media pipeline elements that will be used to process the media objects. This includes data to configure the video decode and video encode logic within the media pipeline, such as encode or decode format. In some embodiments, media pipeline state commands 940 also support the use one or more pointers to "indirect" state elements that contain a batch of state settings.

In some embodiments, media object commands 942 supply pointers to media objects for processing by the media pipeline. The media objects include memory buffers containing video data to be processed. In some embodiments, all media pipeline states must be valid before issuing a media object command 942. Once the pipeline state is configured and media object commands 942 are queued, the media pipeline 924 is triggered via an execute command 944 or an equivalent execute event (e.g., register write). Output from media pipeline 924 may then be post processed by operations provided by the 3D pipeline 922 or the media pipeline 924. In some embodiments, GPGPU operations are configured and executed in a similar manner as media operations.

Figure 21:
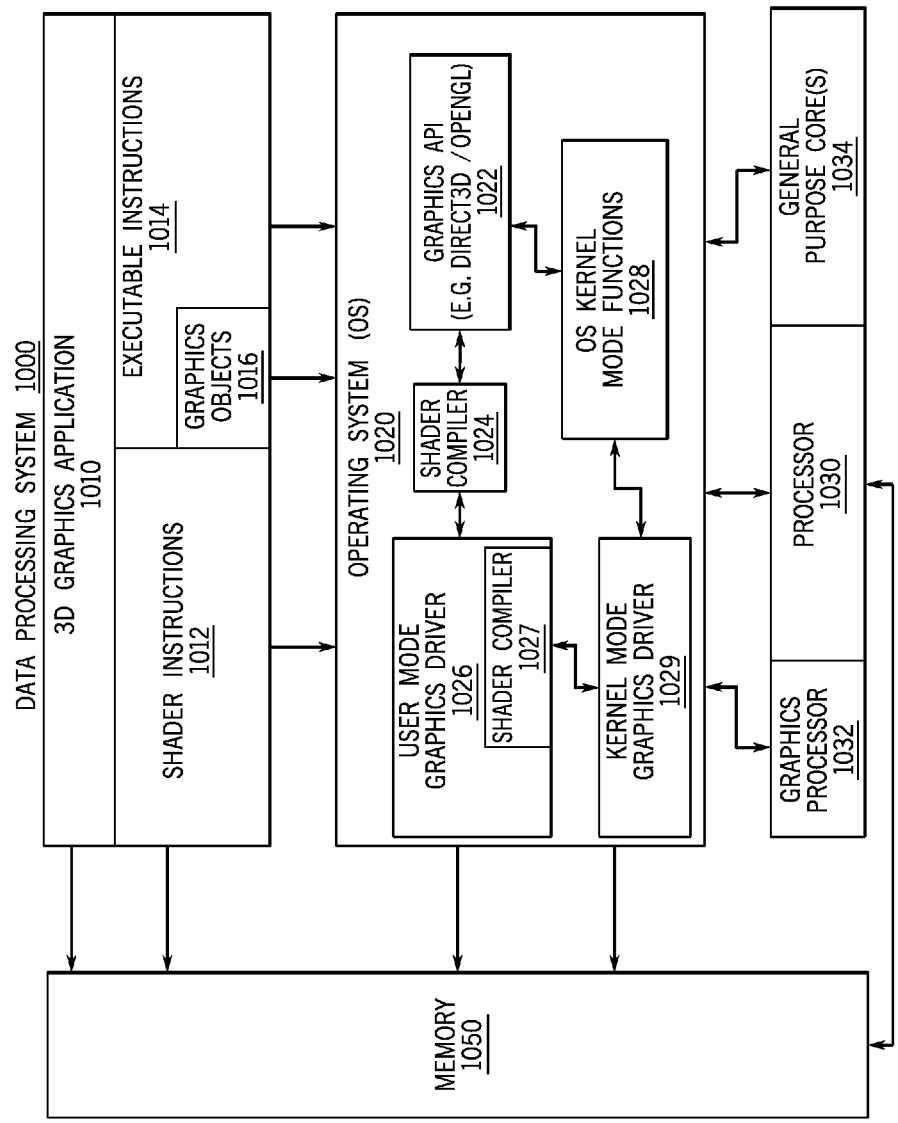
FIG. 21 is a depiction of an exemplary graphics software architecture according to some embodiments.

FIG. 21 illustrates exemplary graphics software architecture for a data processing system 1000 according to some embodiments. In some embodiments, software architecture includes a 3D graphics application 1010, an operating system 1020, and at least one processor 1030. In some embodiments, processor 1030 includes a graphics processor 1032 and one or more general-purpose processor core(s) 1034. The graphics application 1010 and operating system 1020 each execute in the system memory 1050 of the data processing system.

In some embodiments, 3D graphics application 1010 contains one or more shader programs including shader instructions 1012. The shader language instructions may be in a high-level shader language, such as the High Level Shader Language (HLSL) or the OpenGL Shader Language (GLSL). The application also includes executable instructions 1014 in a machine language suitable for execution by the general-purpose processor core 1034. The application also includes graphics objects 1016 defined by vertex data.

In some embodiments, operating system 1020 is a Microsoft® Windows® operating system from the Microsoft Corporation, a proprietary UNIX-like operating system, or an open source UNIX-like operating system using a variant of the Linux kernel. When the Direct3D API is in use, the operating system 1020 uses a front-end shader compiler 1024 to compile any shader instructions 1012 in HLSL into a lower-level shader language. The compilation may be a just-in-time (JIT) compilation or the application can perform shader pre-compilation. In some embodiments, high-level shaders are compiled into low-level shaders during the compilation of the 3D graphics application 1010.

In some embodiments, user mode graphics driver 1026 contains a back-end shader compiler 1027 to convert the shader instructions 1012 into a hardware specific representation. When the OpenGL API is in use, shader instructions 1012 in the GLSL high-level language are passed to a user mode graphics driver 1026 for compilation. In some embodiments, user mode graphics driver 1026 uses operating system kernel mode functions 1028 to communicate with a kernel mode graphics driver 1029. In some embodiments, kernel mode graphics driver 1029 communicates with graphics processor 1032 to dispatch commands and instructions.

One or more aspects of at least one embodiment may be implemented by representative code stored on a machine-readable medium which represents and/or defines logic within an integrated circuit such as a processor. For example, the machine-readable medium may include instructions which represent various logic within the processor. When read by a machine, the instructions may cause the machine to fabricate the logic to perform the techniques described herein. Such representations, known as "IP cores," are reusable units of logic for an integrated circuit that may be stored on a tangible, machine-readable medium as a hardware model that describes the structure of the integrated circuit. The hardware model may be supplied to various customers or manufacturing facilities, which load the hardware model on fabrication machines that manufacture the integrated circuit. The integrated circuit may be fabricated such that the circuit performs operations described in association with any of the embodiments described herein.

Figure 22:
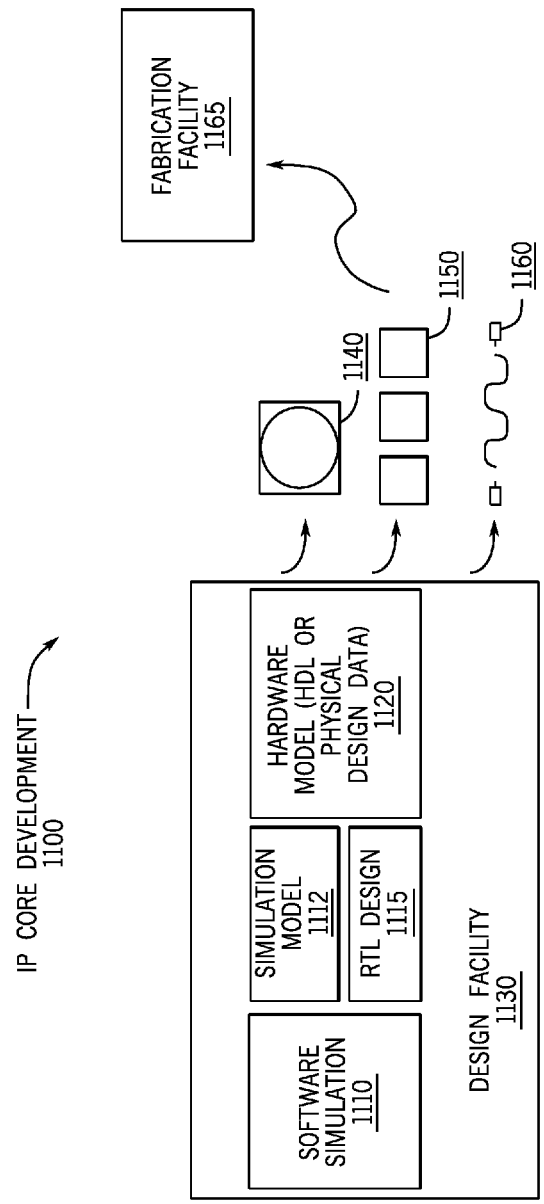
FIG. 22 is a block diagram illustrating an IP core development system according to some embodiments.

FIG. 22 is a block diagram illustrating an IP core development system 1100 that may be used to manufacture an integrated circuit to perform operations according to an embodiment. The IP core development system 1100 may be used to generate modular, re-usable designs that can be incorporated into a larger design or used to construct an entire integrated circuit (e.g., an SOC integrated circuit). A design facility 1130 can generate a software simulation 1110 of an IP core design in a high level programming language (e.g., C/C++). The software simulation 1110 can be used to design, test, and verify the behavior of the IP core using a simulation model 1112. The simulation model 1112 may include functional, behavioral, and/or timing simulations. A register transfer level (RTL) design can then be created or synthesized from the simulation model 1112. The RTL design 1115 is an abstraction of the behavior of the integrated circuit that models the flow of digital signals between hardware registers, including the associated logic performed using the modeled digital signals. In addition to an RTL design 1115, lower-level designs at the logic level or transistor level may also be created, designed, or synthesized. Thus, the particular details of the initial design and simulation may vary.

The RTL design 1115 or equivalent may be further synthesized by the design facility into a hardware model 1120, which may be in a hardware description language (HDL), or some other representation of physical design data. The HDL may be further simulated or tested to verify the IP core design. The IP core design can be stored for delivery to a $3^{rd}$ party fabrication facility 1165 using non-volatile memory 1140 (e.g., hard disk, flash memory, or any non-volatile storage medium). Alternatively, the IP core design may be transmitted (e.g., via the Internet) over a wired connection 1150 or wireless connection 1160. The fabrication facility 1165 may then fabricate an integrated circuit that is based at least in part on the IP core design. The fabricated integrated circuit can be configured to perform operations in accordance with at least one embodiment described herein.

Figure 23:
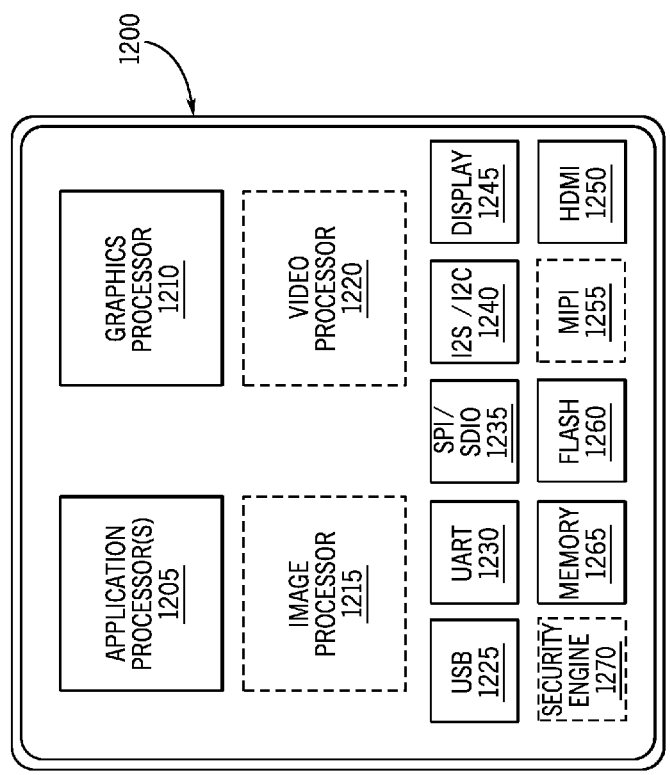
FIG. 23 is a block diagram showing an exemplary system on chip integrated circuit according to some embodiments.

FIG. 23 is a block diagram illustrating an exemplary system on a chip integrated circuit 1200 that may be fabricated using one or more IP cores, according to an embodiment. The exemplary integrated circuit includes one or more application processors 1205 (e.g., CPUs), at least one graphics processor 1210, and may additionally include an image processor 1215 and/or a video processor 1220, any of which may be a modular IP core from the same or multiple different design facilities. The integrated circuit includes peripheral or bus logic including a USB controller 1225, UART controller 1230, an SPI/SDIO controller 1235, and an $I^2S/I^2C$ controller 1240. Additionally, the integrated circuit can include a display device 1245 coupled to one or more of a high-definition multimedia interface (HDMI) controller 1250 and a mobile industry processor interface (MIPI) display interface 1255. Storage may be provided by a flash memory subsystem 1260 including flash memory and a flash memory controller. Memory interface may be provided via a memory controller 1265 for access to SDRAM or SRAM memory devices. Some integrated circuits additionally include an embedded security engine 1270.

Additionally, other logic and circuits may be included in the processor of integrated circuit 1200, including additional graphics processors/cores, peripheral interface controllers, or general purpose processor cores.

The following clauses and/or examples pertain to further embodiments:

One example embodiment may be a method comprising receiving a media including symbols, encoding symbols with Rice encoding, and encoding other symbols with another encoding technique. The method may also include wherein encoding symbols including encoding only three symbols with said another encoding technique. The method may also include wherein said another encoding technique is exponential Golomb encoding. The method may also include wherein encoding symbols including encoding only two symbols with said another encoding technique. The method may also include wherein said another technique is unary coding.

Another example embodiment may be one or more non-transitory computer readable media storing instructions executed by a computer to perform a sequence comprising receiving a media including symbols, encoding symbols with Rice encoding, and encoding symbols with another encoding technique. The media may also include further storing instructions to perform a sequence wherein encoding symbols including encoding only three symbols with said another encoding technique. The media may also include further storing instructions to perform a sequence wherein said another encoding technique is exponential Golomb encoding. The media may also include further storing instructions to perform a sequence wherein encoding symbols including encoding only two symbols with said other encoding technique. The media may also include further storing instructions to perform a sequence wherein said another technique is unary coding.

In another example embodiment may be an apparatus comprising a processor to receive a media including symbols, encode symbols with Rice encoding, and encode symbols with another encoding technique, and a memory coupled to said processor. The apparatus may include wherein encoding symbols including encoding only three symbols with said another encoding technique. The apparatus may include wherein said another encoding technique is exponential Golomb encoding. The apparatus may include wherein encoding symbols including encoding only two symbols with said another encoding technique. The apparatus may include wherein said another technique is unary coding.

In still another embodiment one or more non-transitory computer readable media storing instructions executed by a computer to perform a sequence comprising receiving a symbol, identifying a symbol number of the symbol, and selecting one of at least two decoding techniques based on the symbol number. The media may include further storing instructions to perform a sequence including to select one of Rice encoding and exponential Golomb encoding. The media may include further storing instructions to perform a sequence including to select Rice encoding for symbols 0, 1 and 2. The media may include further storing instructions to perform a sequence including to select exponential Golomb encoding for symbols numbered 3 and higher. The media may include further storing instructions to perform a sequence to select between Rice encoding and unary coding. The media may include further storing instructions to perform a sequence including to select Rice encoding for symbols 0 or 1. The media may include further storing instructions to perform a sequence including to select unary coding for symbols numbered 2 and higher.

The graphics processing techniques described herein may be implemented in various hardware architectures. For example, graphics functionality may be integrated within a chipset. Alternatively, a discrete graphics processor may be used. As still another embodiment, the graphics functions may be implemented by a general purpose processor, including a multicore processor.

References throughout this specification to "one embodiment" or "an embodiment" mean that a particular feature, structure, or characteristic described in connection with the embodiment is included in at least one implementation encompassed within the present disclosure. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While a limited number of embodiments have been described, those skilled in the art will appreciate numerous modifications and variations therefrom. It is intended that the appended claims cover all such modifications and variations as fall within the true spirit and scope of this disclosure.

What is claimed is:

1. A method comprising:
receiving a media including symbols;
encoding symbols with Rice encoding; and
encoding only three symbols with another encoding technique.

2. The method of claim 1 wherein said another encoding technique is exponential Golomb encoding.

3. The method of claim 1 wherein encoding symbols including encoding only two symbols with said another encoding technique.

4. The method of claim 3 wherein said another technique is unary coding.

5. One or more non-transitory computer readable media storing instructions executed by a computer to perform a sequence comprising:
receiving a media including symbols;
encoding symbols with Rice encoding; and
encoding only three symbols with another encoding technique.

6. The media of claim 5 further storing instructions to perform a sequence wherein encoding symbols including encoding only two symbols with said another encoding technique.

7. The media of claim 6 further storing instructions to perform a sequence wherein said another technique is unary coding.

8. The media of claim 1 further storing instructions to perform a sequence wherein said another encoding technique is exponential Golomb encoding.

9. An apparatus comprising:
a processor to receive a media including symbols, encode symbols with Rice encoding, and encode only three symbols with another encoding technique; and
a memory coupled to said processor.

10. The apparatus of claim 9, wherein said another encoding technique is exponential Golomb encoding.

11. The apparatus of claim 9, wherein encoding symbols including encoding only two symbols with said another encoding technique.

12. The apparatus of claim 11, wherein said another technique is unary coding.

13. One or more non-transitory computer readable media storing instructions executed by a computer to perform a sequence comprising:
receiving a symbol;
identifying a symbol number of the symbol; and
selecting one of at least two decoding techniques based on the symbol number.

14. The media of claim 13 further storing instructions to perform a sequence to select between Rice encoding and unary coding.

15. The media of claim 14 further storing instructions to perform a sequence including to select Rice encoding for symbols 0 or 1.

16. The media of claim 15 further storing instructions to perform a sequence including to select unary coding for symbols numbered 2 and higher.

17. The media of claim 13 further storing instructions to perform a sequence including to select one of Rice encoding and exponential Golomb encoding.

18. The media of claim 17 further storing instructions to perform a sequence including to select Rice encoding for symbols 0, 1 and 2.

19. The media of claim 18 further storing instructions to perform a sequence including to select exponential Golomb encoding for symbols numbered 3 and higher.

* * * * *